(12) United States Patent
Hosotani et al.

(10) Patent No.: US 7,920,412 B2
(45) Date of Patent: Apr. 5, 2011

(54) MAGNETIC RANDOM ACCESS MEMORY AND METHOD OF MANUFACTURING THE SAME

(75) Inventors: Keiji Hosotani, Sagamihara (JP);
Yoshiaki Asao, Sagamihara (JP);
Akihiro Nitayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 12/605,072

(22) Filed: Oct. 23, 2009

(65) Prior Publication Data
US 2010/0047930 A1 Feb. 25, 2010

Related U.S. Application Data

(63) Continuation of application No. 11/839,265, filed on Aug. 15, 2007, now Pat. No. 7,706,175.

(30) Foreign Application Priority Data
Sep. 29, 2006 (JP) .................................. 2006-269334

(51) Int. Cl.
*G11C 11/00* (2006.01)
(52) U.S. Cl. ........................................ 365/158; 365/148
(58) Field of Classification Search .................. 365/158, 365/148, 171, 173; 438/3; 257/E21.001
See application file for complete search history.

(56) References Cited

U.S. PATENT DOCUMENTS

| | | | |
|---|---|---|---|
| 6,947,315 B2 | 9/2005 | Iwata | |
| 6,958,932 B2 * | 10/2005 | Hosotani et al. | |
| 6,977,401 B2 | 12/2005 | Hosotani | |
| 7,046,545 B2 | 5/2006 | Hosotani | |
| 7,164,599 B2 | 1/2007 | Hosotani et al. | |
| 7,247,505 B2 | 7/2007 | Hosotani | |
| 2003/0123199 A1 * | 7/2003 | Honda et al. | 360/324 |
| 2005/0270828 A1 * | 12/2005 | Motoyoshi | 365/158 |
| 2005/0274984 A1 | 12/2005 | Hosotani et al. | |
| 2007/0076469 A1 * | 4/2007 | Ashida et al. | 365/158 |

FOREIGN PATENT DOCUMENTS

| | | |
|---|---|---|
| JP | 2004-80051 | 3/2004 |
| JP | 2004-179187 | 6/2004 |
| JP | 2005-175357 | 6/2005 |

OTHER PUBLICATIONS

M. Durlam et al., "90nm Toggle MRAM Array with 0.29μm2 Cells," 2005 Symposium on VLSI Technology Digest of Technical Papers, pp. 186-187. Roy Scheuerlein et al., "A 10ns Read and Write Non-Volatile Memory Array Using a Magnetic Tunnel Junction and FET Switch in each Cell," ISSCC 2000/Session 7 / TD: Emerging Memory & Device Technologies / Paper TA 7.2, 2000 IEEE International Solid State Circuits Conference, Feb. 2000, pp. 128-129.

* cited by examiner

*Primary Examiner* — Vu A Le
(74) *Attorney, Agent, or Firm* — Oblon, Spivak, McClelland, Maier & Neustadt, L.L.P.

(57) ABSTRACT

A magnetic random access memory includes a first wiring, a second wiring formed above and spaced apart from the first wiring, a magnetoresistive effect element formed between the first wiring and the second wiring, formed in contact with an upper surface of the first wiring, and having a fixed layer, a recording layer, and a nonmagnetic layer formed between the fixed layer and the recording layer, a metal layer formed on the magnetoresistive effect element and integrated with the magnetoresistive effect element to form stacked layers, a first side insulating film formed on side surfaces of the metal layer, the magnetoresistive effect element, and the first wiring, a first contact formed in contact with a side surface of the first side insulating film, and a third wiring formed on the metal layer and the first contact to electrically connect the magnetoresistive effect element and the first contact.

5 Claims, 25 Drawing Sheets

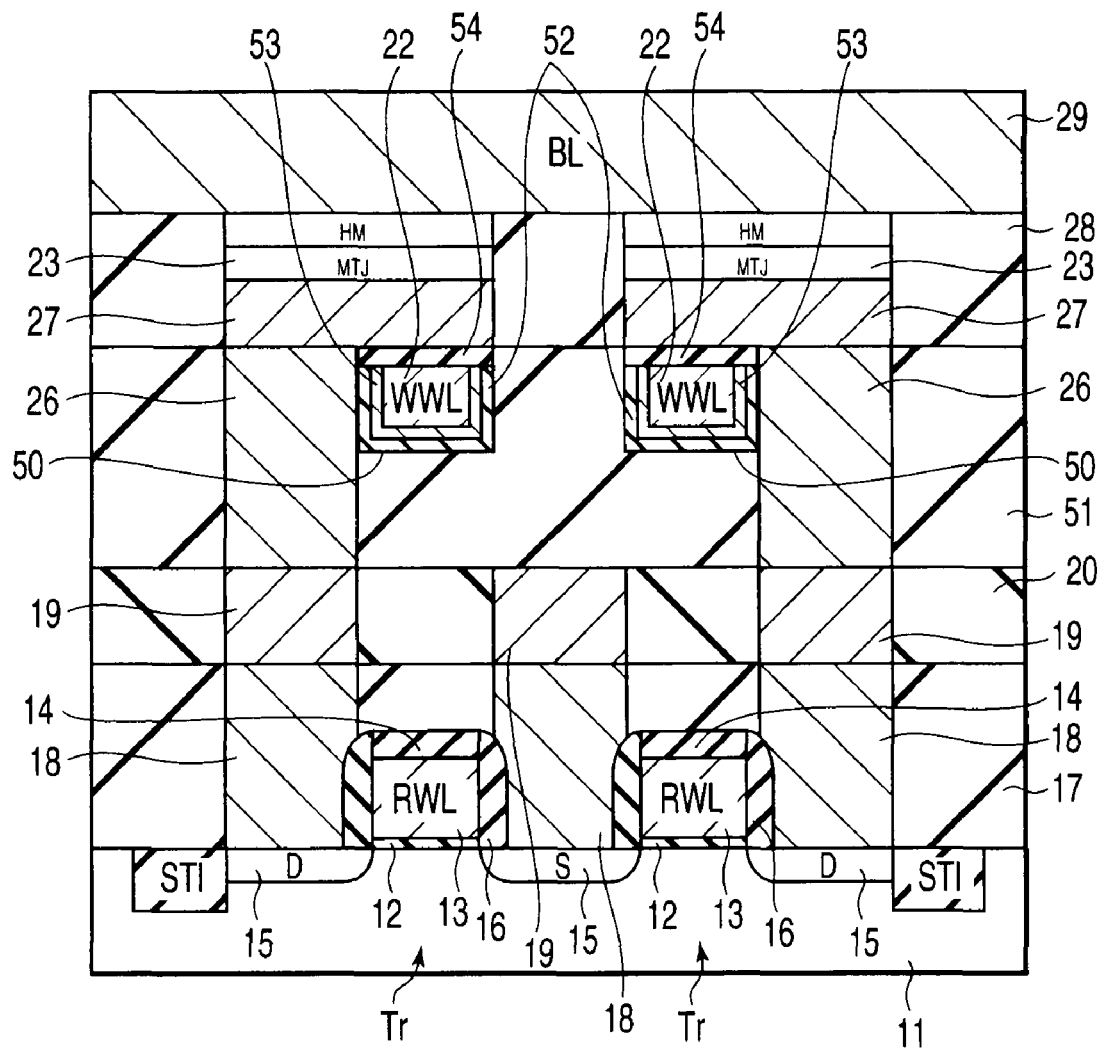
F I G. 23

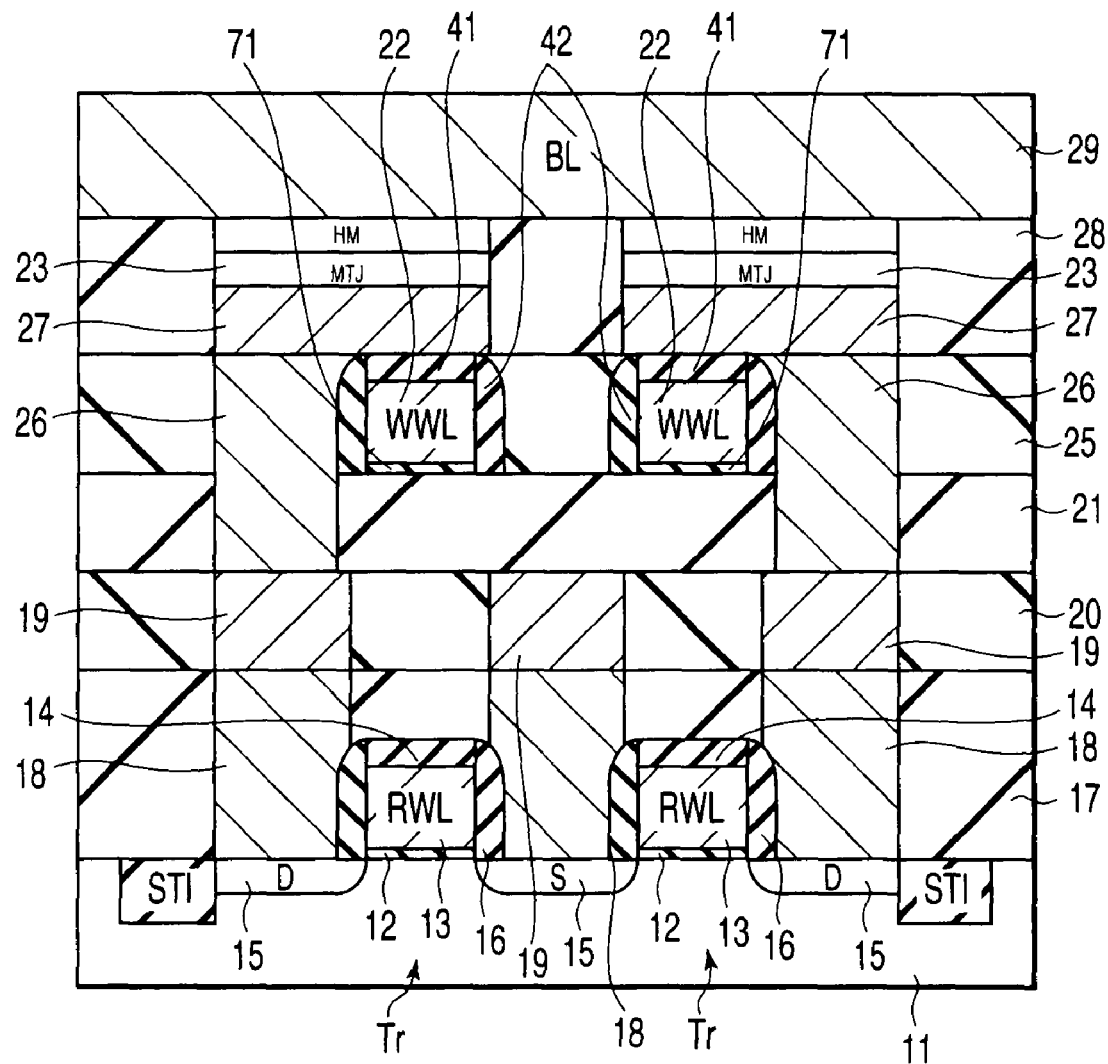
F I G. 32

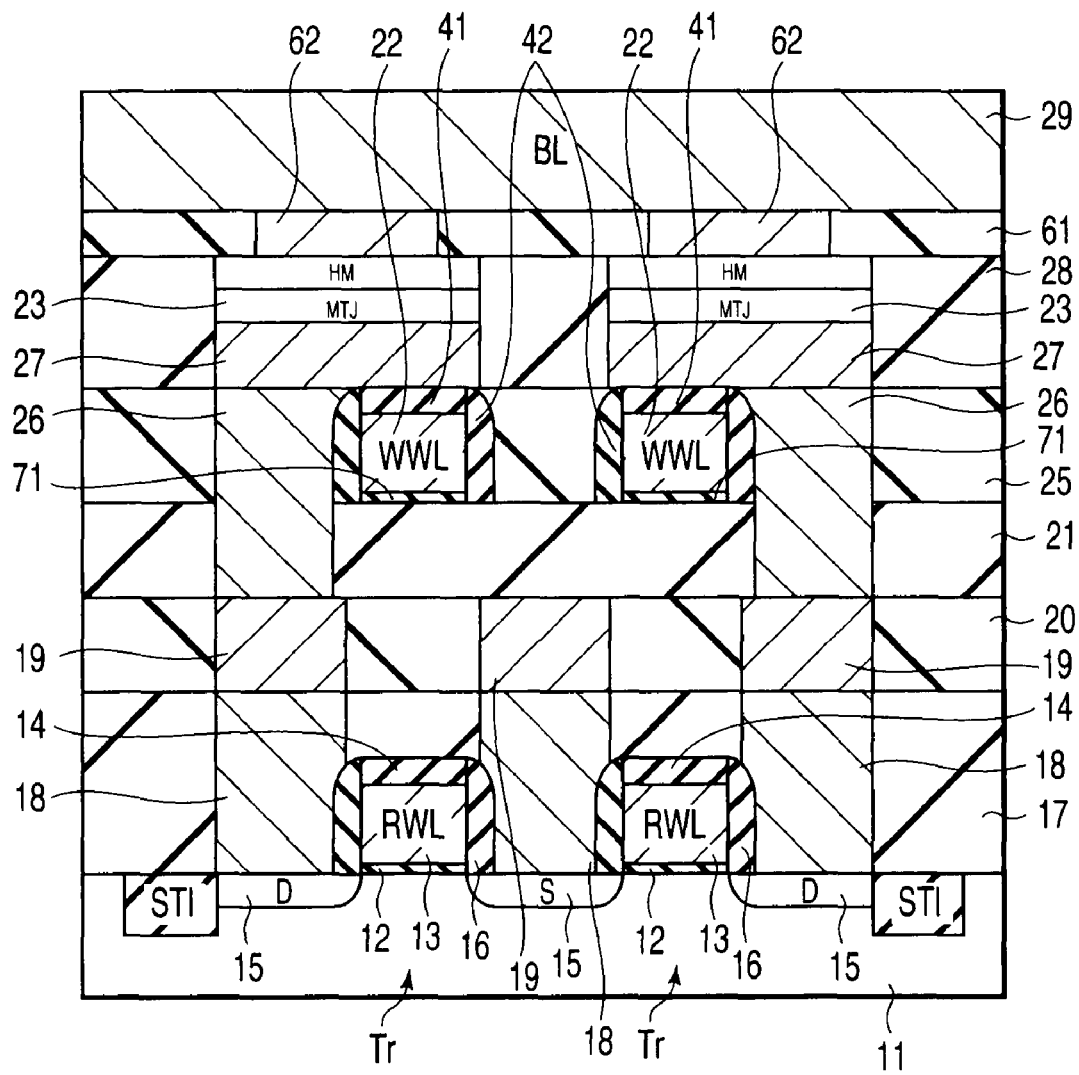
F I G. 33

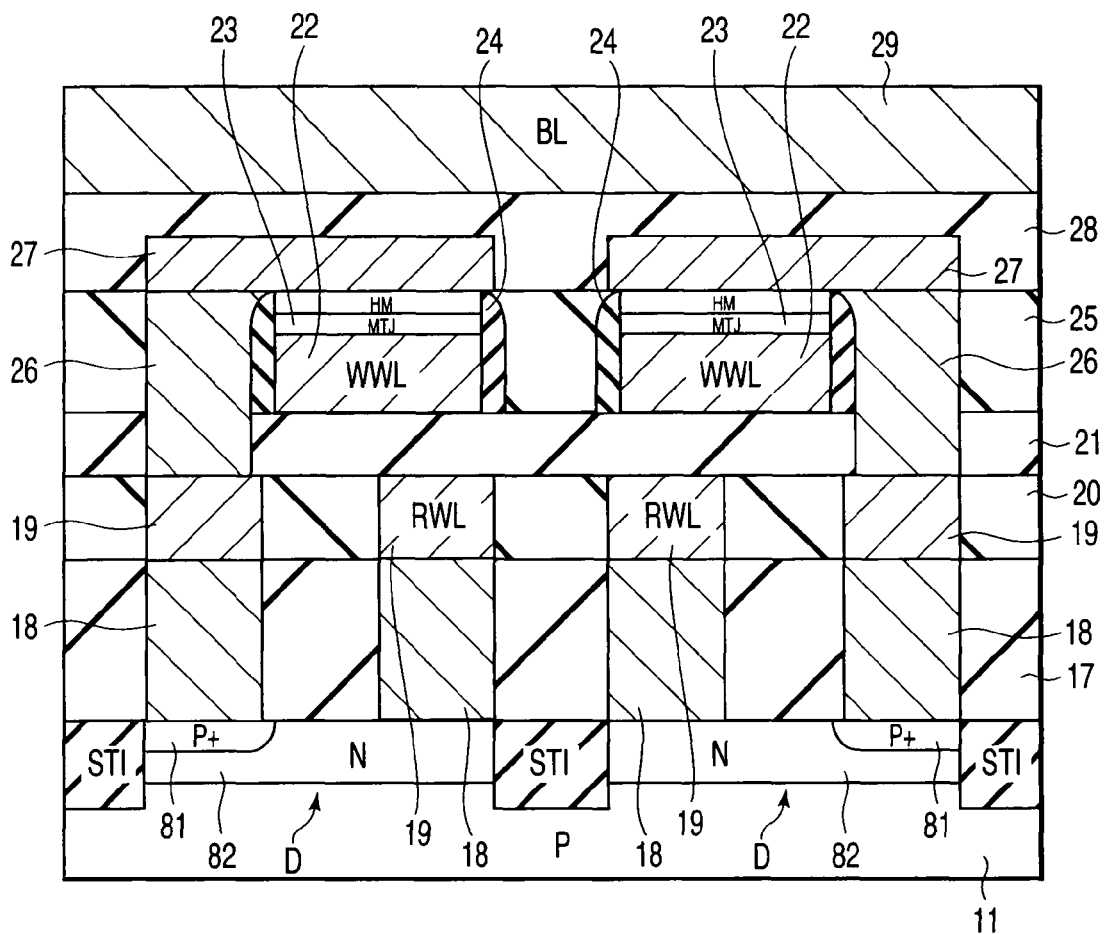
F I G. 3 4

Via hole process

Dual damascene process

MAGNETIC RANDOM ACCESS MEMORY AND METHOD OF MANUFACTURING THE SAME

CROSS-REFERENCE TO RELATED APPLICATIONS

This application is a continuation of and claims the benefit of priority under 35 U.S.C. §120 from U.S. Ser. No. 11/839,265 filed Aug. 15, 2007, and claims the benefit of priority under 35 U.S.C. §119 from Japanese Patent Application No. 2006-269334 filed Sep. 29, 2006, the entire contents of each of which are incorporated herein by reference.

BACKGROUND OF THE INVENTION

1. Field of the Invention

The present invention relates to a magnetic random access memory (MRAM) using the magnetoresistive effect, and a method of manufacturing the same.

2. Description of the Related Art

Recently, many types of memory for storing information by the application of new principles have been proposed. One such type, as proposed by Roy Scheuerlein et al., is the magnetic random access memory using the tunneling magnetoresistive (TMR) effect. (See non-patent reference 1.)

A magnetic random access memory stores a binary value in a magnetic tunnel junction (MTJ) element. The MTJ element has a structure in which two magnetic layers (ferromagnetic layers) sandwich an insulating layer (tunnel barrier). Whether value stored in the MTJ element is binary 1 or 0 is determined in accordance with whether the spin directions in the two magnetic layers are parallel or antiparallel.

Data written in the MTJ element is read as follows. Switching elements are connected in series with MTJ elements, and only a switching element connected to a selected read word line is turned on to form a current path. Since a current flows to only the selected MTJ element, data can be read from the MTJ element.

When a MOSFET is used as the switching element, the cell size is $12F^2$ if the short side (the width in the magnetic hard axis direction) of the MTJ element is F (Feature size) and the long side (the width in the magnetic easy axis direction) is 2F. Accordingly, the cell size of the magnetic random access memory is larger than those of a DRAM and flash memory. The cell size becomes $10F^2$, therefore, if an easy axis write bit line is formed below the MTJ element and the lower electrode of the MTJ element and the fringe of the contact of the lower electrode are self-aligned. However, the decrease in cell size is still unsatisfactory.

[Non-patent reference 1] Roy Scheuerlein et al., ISSCC2000 Technical Digest p. 128, "A 10 ns Read and Write Non-Volatile Memory Array Using a Magnetic Tunnel Junction and FET Switch in each Cell"

[Patent reference 1] Jpn. Pat. Appln. KOKAI Publication No. 2005-175357

BRIEF SUMMARY OF THE INVENTION

A magnetic random access memory according to the first aspect of the present invention comprises a first wiring, a second wiring formed above and spaced apart from the first wiring, a magnetoresistive effect element formed between the first wiring and the second wiring, formed in contact with an upper surface of the first wiring, and having a fixed layer, a recording layer, and a nonmagnetic layer formed between the fixed layer and the recording layer, a metal layer formed on the magnetoresistive effect element and integrated with the magnetoresistive effect element to form stacked layers, a first side insulating film formed on side surfaces of the metal layer, the magnetoresistive effect element, and the first wiring, a first contact formed in contact with a side surface of the first side insulating film, and a third wiring formed on the metal layer and the first contact to electrically connect the magnetoresistive effect element and the first contact.

A magnetic random access memory according to the second aspect of the present invention comprises a first wiring, a second wiring formed above and spaced apart from the first wiring, a magnetoresistive effect element formed between the first wiring and the second wiring, connected to the second wiring, and having a fixed layer, a recording layer, and a nonmagnetic layer formed between the fixed layer and the recording layer, a first side insulating film formed on a side surface of the first wiring, a first top insulating film formed on an upper surface of the first wiring, and a first contact formed below the magnetoresistive effect element, having a side surface in contact with a side surface of the first side insulating film, and electrically connected to the magnetoresistive effect element.

A magnetic random access memory manufacturing method according to the third aspect of the present invention comprises forming a switching element on a semiconductor substrate, forming a first wiring above the switching element, forming, on the first wiring, a magnetoresistive effect element having a fixed layer, a recording layer, and a nonmagnetic layer formed between the fixed layer and the recording layer, forming a metal layer on the magnetoresistive effect element, forming a first side insulating film on side surfaces of the first wiring, the magnetoresistive effect element, and the metal layer, forming a first interlayer insulating film covering the metal layer, exposing the metal layer by planarizing the first interlayer insulating film, forming a contact hole which exposes a portion of the first side insulating film, forming, in the contact hole, a first contact connecting to the switching element, forming a second wiring on the first contact and the metal layer to electrically connect the metal layer and the switching element by the second wiring, forming a second interlayer insulating film on the second wiring, and forming a third wiring on the second interlayer insulating film.

BRIEF DESCRIPTION OF THE SEVERAL VIEWS OF THE DRAWING

FIG. 23 is a sectional view showing modification example 1 of the magnetic random access memory according to the second embodiment of the present invention;

FIGS. 31 to 33 are sectional views showing magnetic random access memories according to the third embodiment of the present invention;

FIGS. 34 and 35 are sectional views showing magnetic random access memories according to the fourth embodiment of the present invention;

DETAILED DESCRIPTION OF THE INVENTION

Figure 1:
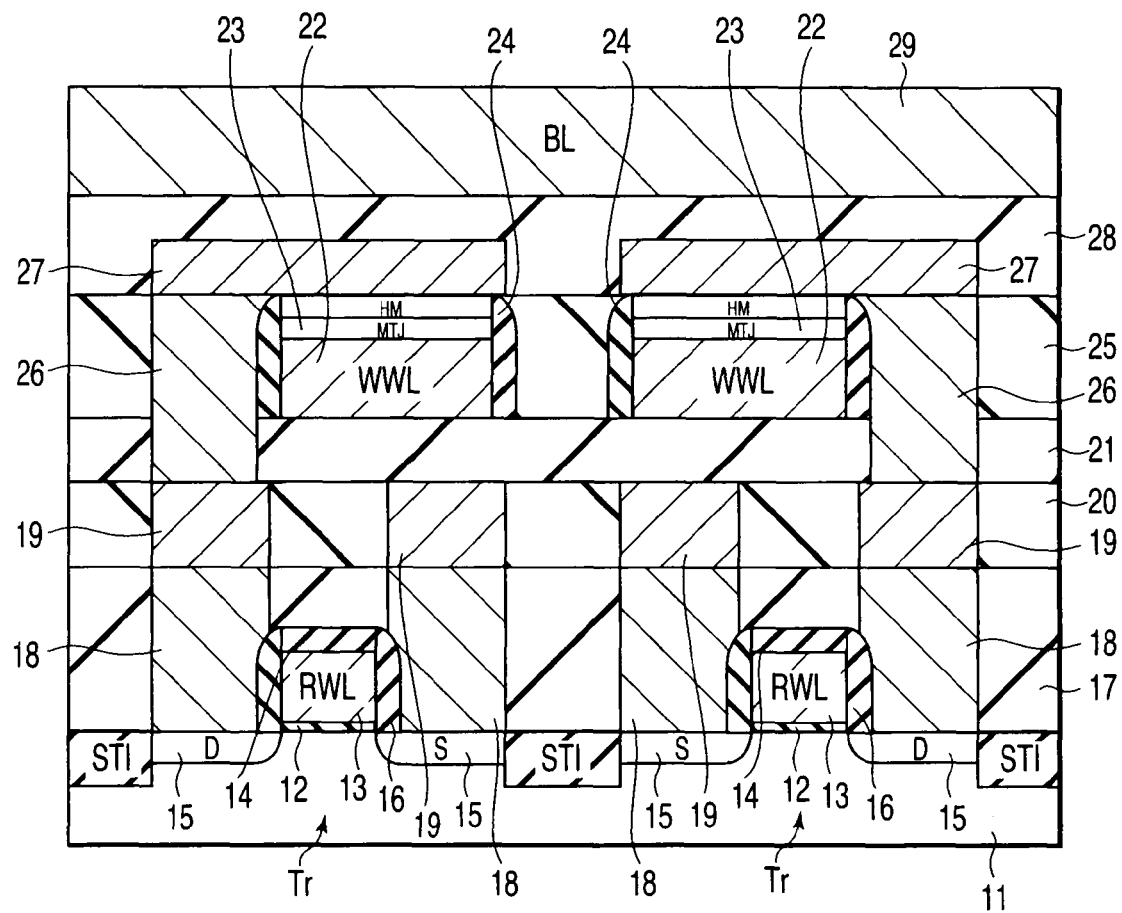
FIG. 1 is a sectional view showing a basic example of a magnetic random access memory according to the first embodiment of the present invention.

Embodiments of the present invention will be explained below with reference to the accompanying drawing. The same reference numerals denote the same parts throughout the drawing.

[1] First Embodiment

[1-1] Basic Example of a Magnetic Random Access Memory

Figure 2A:
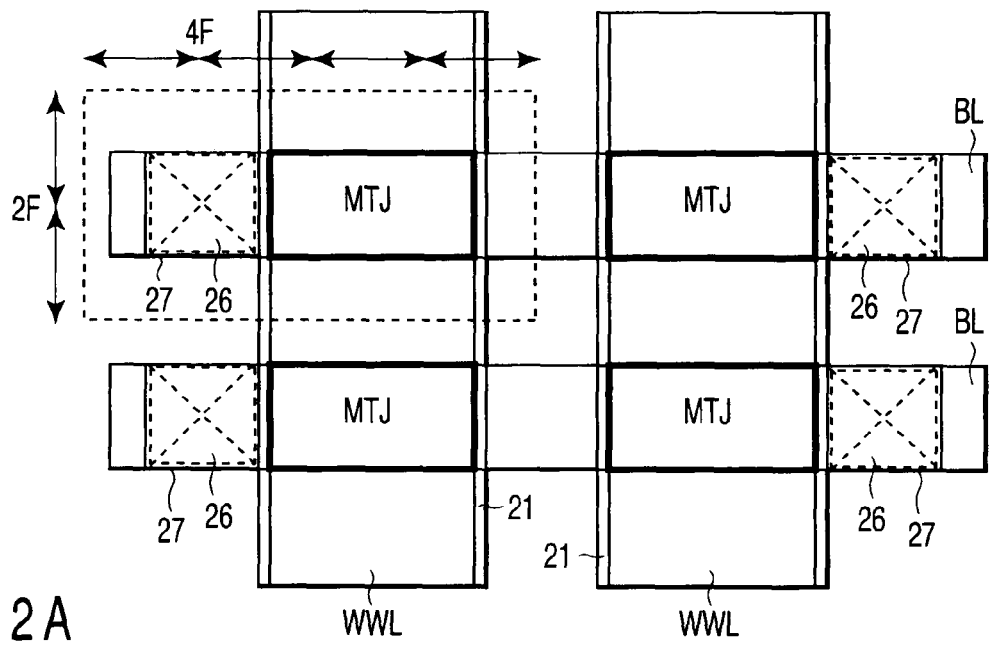
FIG. 2A is a plan view showing the periphery of an MTJ element according to the first embodiment of the present invention.
Figure 2B:
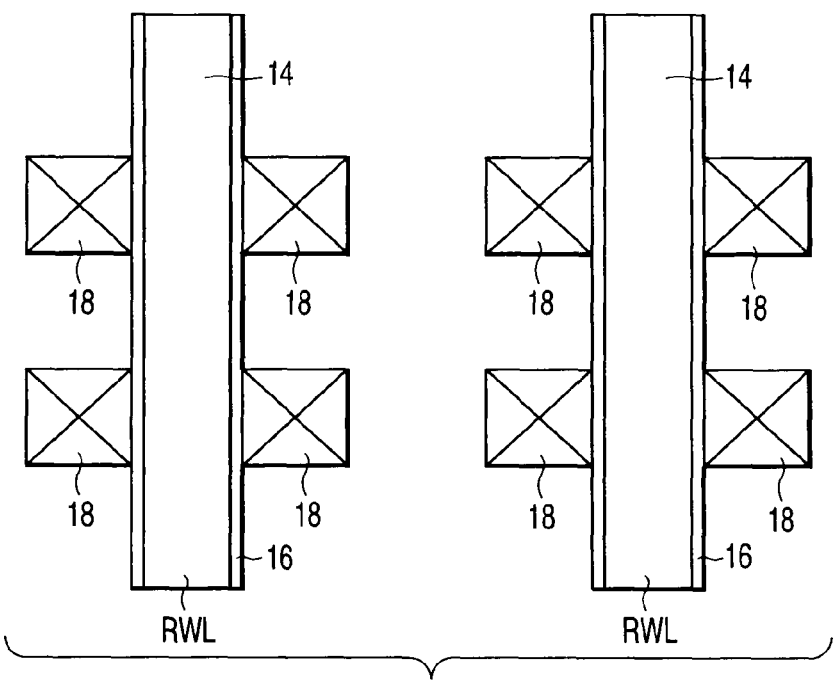
FIG. 2B is a plan view showing the periphery of a gate electrode according to the first embodiment of the present invention.

FIG. 1 is a sectional view showing a basic example of a magnetic random access memory according to the first embodiment of the present invention. FIG. 2A is a plan view showing the periphery of an MTJ element according to the first embodiment of the present invention. FIG. 2B is a plan view showing the periphery of a gate electrode according to the first embodiment of the present invention. The basic example of the magnetic random access memory according to the first embodiment will be explained below.

As shown in FIG. 1, a gate electrode 13 is formed on a semiconductor substrate 11 via a gate insulating film 12. Source/drain diffusion layers 15 are formed in the semiconductor substrate 11 on the two sides of the gate electrode 13, thereby forming a metal oxide semiconductor (MOS) transistor Tr as a switching element. Side insulating films 16 are formed on the side surfaces of the gate electrode 13, and a top insulating film 14 is formed on the upper surface of the gate electrode 13. The gate electrode 13 functions as a read word line RWL.

A contact 18 is connected to each source/drain diffusion layer 15. The contact 18 is formed in self-alignment with the gate electrode 13 and side insulating film 16. Therefore, the contact 18 is in direct contact with the side surface of the side insulating film 16. A portion of the contact 18 covers the upper portion of the side insulating film 16.

A write word line WWL is formed above the gate electrode 13. An MTJ element MTJ is formed on the write word line WWL. A conductive hard mask HM (metal layer) is formed on the MTJ element MTJ so as to be integrated with it to form stacked layers. The planar shape of the hard mask HM is, for example, the same as that of the MTJ element MTJ. The side surfaces in the magnetic easy axis direction of the MTJ element MTJ are aligned with the side surfaces of the hard mask HM and bit lint BL. Side insulating films 24 are formed on the side surfaces of the hard mask HM, the side surfaces in the magnetic easy axis direction of the MTJ element MTJ, and the side surfaces of the write word line WWL.

A wiring 27 is formed on the hard mask HM. A contact 26 is formed below the wiring 27. The contact 26 is formed in self-alignment with the hard mask HM, MTJ element MTJ, write word line WWL, and side insulating film 24. Accordingly, the contact 26 is in direct contact with the side surface of the side insulating film 24. A portion of the contact 26 covers the upper portion of the side insulating film 24. One side surface in the magnetic easy axis direction of the wiring 27 is aligned with the side surface of the contact 26, and the other side surface is aligned with the side surface of the side insulating film 24. A bit line BL is formed above the MTJ element MTJ so as to be spaced apart from the wiring 27.

Desirable examples of the material of the hard mask HM are metals (for example, Ru) that remain conductive even when oxidized, refractory metals (for example, Ta, Ti, and W) that relatively stably remain conductive even when oxidized, and refractory metal compounds (for example, TiN, TaN, and WN) having high oxidation resistance.

The material of the side insulating film 24 is desirably different from that of an interlayer insulating film 25. This is to increase the etching selectivity between the two materials during the formation of the contact 26. For example, when the interlayer insulating film 25 is silicon oxide ($SiO_2$), the side insulating film 24 is preferably silicon nitride (SiN) or alumina ($Al_xO_y$).

The material of the side insulating film 16 and top insulating film 14 is desirably different from that of an interlayer insulating film 17. This is to increase the etching selectivity during the formation of the contact 18. For example, when the interlayer insulating film 17 is $SiO_2$, the side insulating film 16 and top insulating film 14 are preferably SiN or AlxOy. Note that the side insulating film 16 and top insulating film 14 are desirably the same material in view of the adhesion of the material and the like, but they may also be different materials.

The thickness Tt1 of the top insulating film 14 is desirably greater than the thickness Ts1 of the side insulating film 16. This is to allow the top insulating film 14 to adequately protect the upper end portion and the like of the gate electrode 13 from being etched away during the formation of the contact 18.

The relationship between the film thickness Tt1 of the top insulating film 14 and the film thickness Ts1 of the side insulating film 16 desirably satisfies, for example, $Tt1 \times 1/3 \leq Ts1 \leq Tt1 \times 1/2$. The lower limit is mainly defined on the basis of the etching selectivity during the formation of the contact 18 and the insulation breakdown voltage. The upper limit is defined so as to ensure a minimum necessary width of the contact hole (particularly, the side width of the contact hole) when the contact 18 is formed by etching.

The film thickness of the side insulating film 16 is, for example, about 10 to 50 nm. The film thickness of the side insulating film 24 is, for example, about 10 to 50 nm. The film thicknesses of the side insulating films 16 and 24 are adjusted by damage absorption during etching and the dielectric breakdown voltage.

FIGS. 3 to 9 are sectional views showing the manufacturing steps of the basic example of the magnetic random access memory according to the first embodiment of the present invention. A method of manufacturing the basic example of the magnetic random access memory according to the first embodiment will be explained below.

Figure 3:
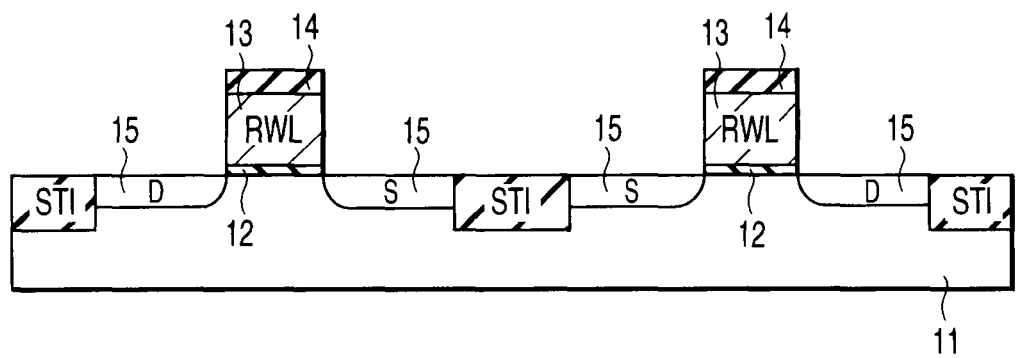
FIGS. 3 to 9 are sectional views showing the manufacturing steps of the basic example of the magnetic random access memory according to the first embodiment of the present invention.

First, as shown in FIG. 3, element isolation regions STI having an STI (Shallow Trench Isolation) structure are formed in a semiconductor substrate (for example, a silicon substrate) 11. Then, a gate insulating film 12 is formed on the semiconductor substrate 11, and a gate electrode 13 made of polysilicon or the like is formed on the gate insulating film 12. A top insulating film 14 is formed on the gate electrode 13. The top insulating film 14 is, for example, SiN. After that, the gate insulating film 12, gate electrode 13, and top insulating film 14 are patterned into a desired shape. Subsequently, source/drain diffusion layers 15 are formed in the semiconductor substrate 11. The gate electrodes 13 function as, for example, read word lines RWL.

Figure 4:
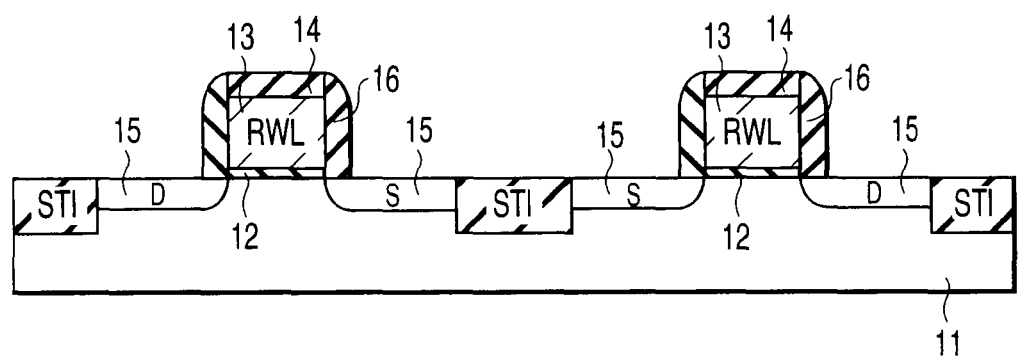

As shown in FIG. 4, a side insulating film 16 is formed on the semiconductor substrate 11 and top insulating films 14, and patterned to remain on the side surfaces of the gate insulating films 12, gate electrodes 13, and top insulating films 14. The side insulating film 16 is, for example, SiN.

Figure 5:
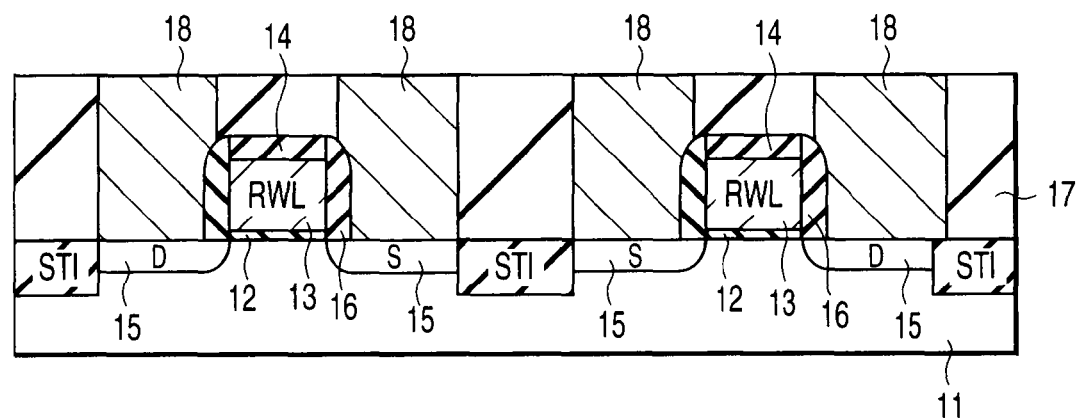

As shown in FIG. 5, an interlayer insulating film 17 of $SiO_2$ or the like is formed on the semiconductor substrate 11 and top insulating films 14. Contact holes are formed in the interlayer insulating film 17 by reactive ion etching (RIE) or the like, and filled with tungsten (W) or the like to form contacts 18. Each contact 18 can be formed in self-alignment with the side insulating film 16 and gate electrode 13 by forming the contact hole so as to expose the side surface of the side insulting film 16.

Figure 6:
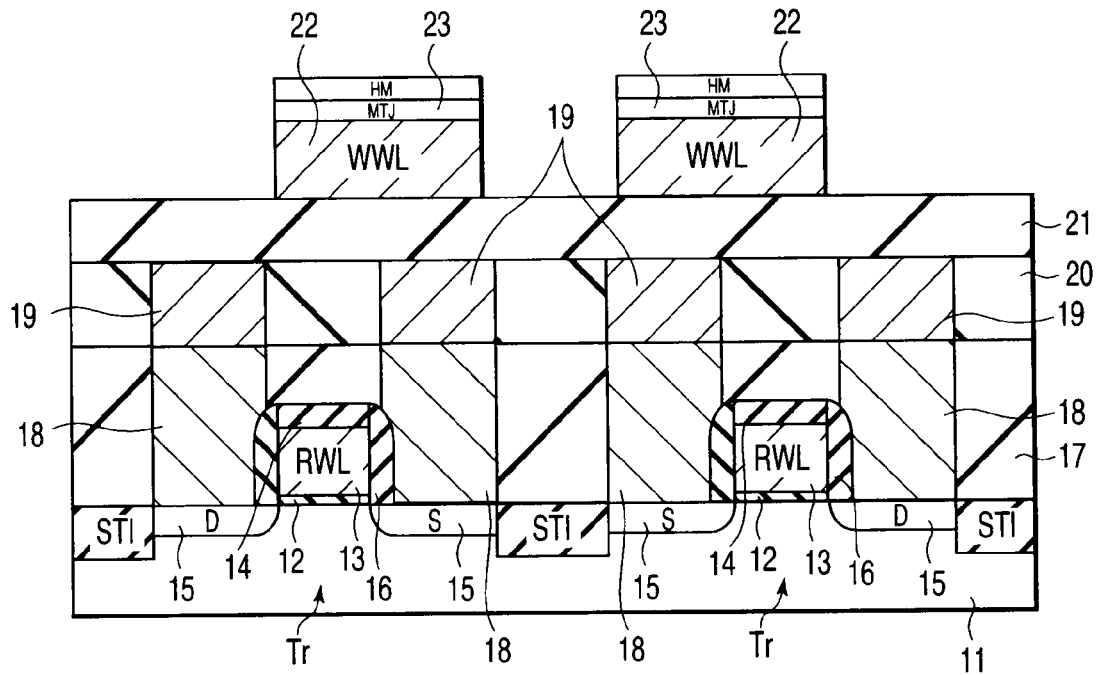

As shown in FIG. 6, wirings 19 connecting to the contacts 18 are formed and buried with an interlayer insulating film 20. The interlayer insulating film 20 is then planarized until the wirings 19 are exposed. Subsequently, an interlayer insulating film 21 of $SiO_2$ or the like is formed on the wirings 19 and interlayer insulating film 20. A wiring 22 of, for example, AlCu is formed on the interlayer insulating film 21. An MTJ element film 23 and hard mask HM are formed on the wiring 22. After the hard mask HM is patterned, the wiring 22 and MTJ element film 23 are patterned into a desired shape. In this manner, bit lines BL and MTJ elements MTJ are formed.

Figure 7:
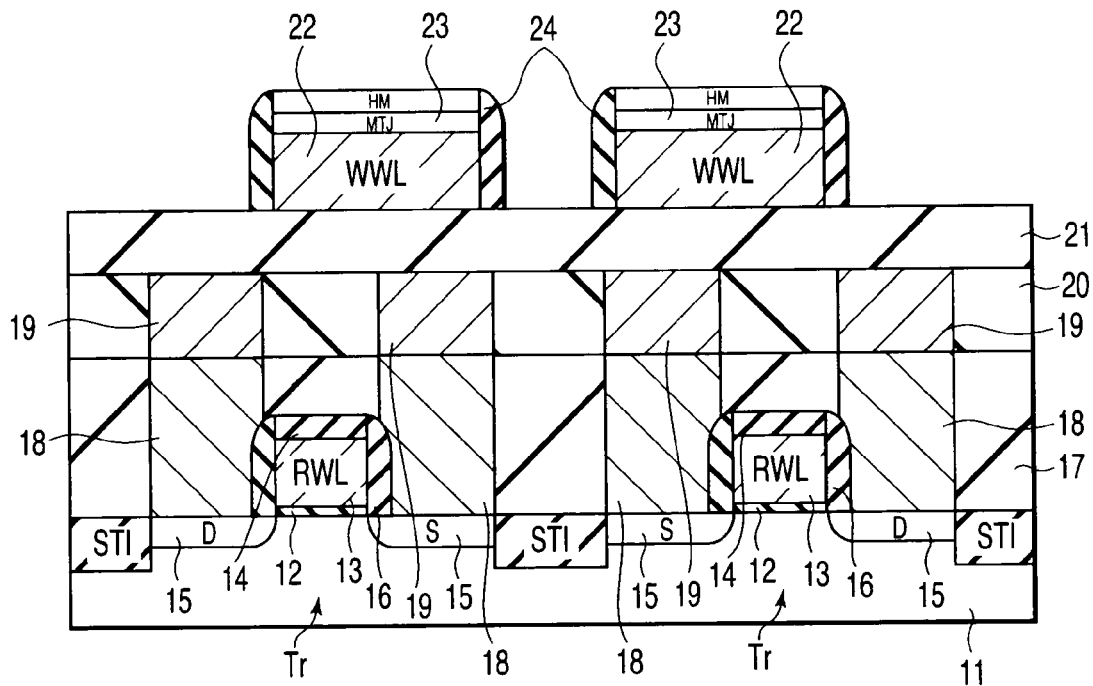

As shown in FIG. 7, side insulating films 24 are formed on the side surfaces of the bit lines BL, MTJ elements MTJ, and hard masks HM. The side insulating film 24 is, for example, SiN.

Figure 8:
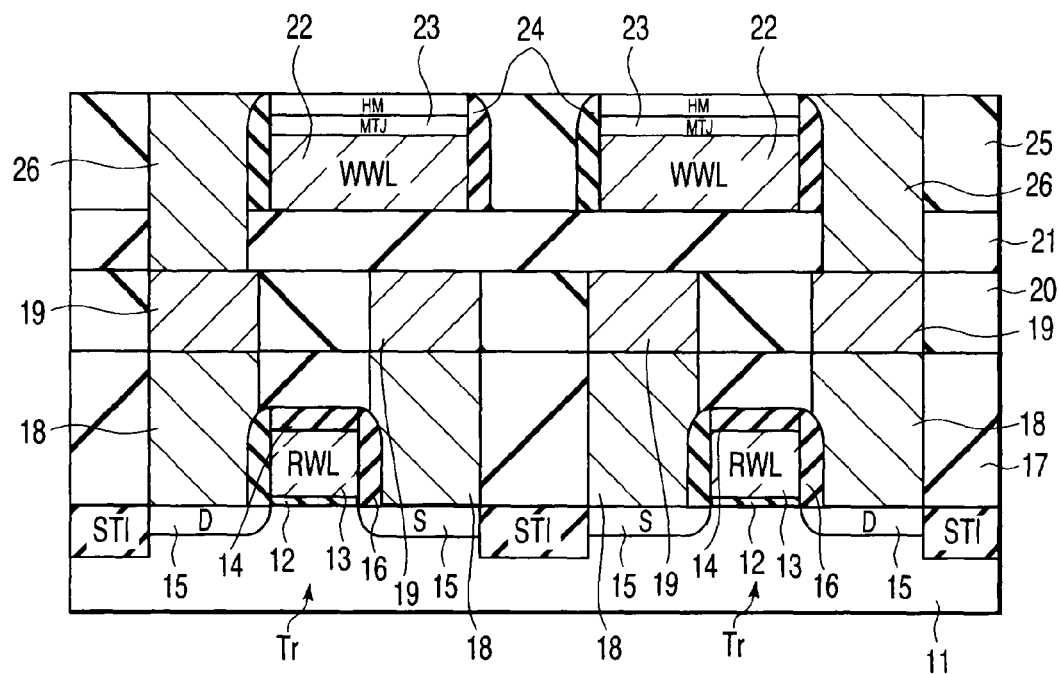

As shown in FIG. 8, an interlayer insulating film 25 of, for example, $SiO_2$ is formed to cover the hard masks HM, and planarized until the hard masks HM are exposed. After that, contact holes are formed in the interlayer insulating films 21 and 25 by RIE or the like, thereby partially exposing the side insulating films 24. In this step, the hard masks HM are sometimes partially exposed when the contact holes are formed. Contacts 26 are formed by burying W or the like in the contact holes. The contacts 26 are connected to the wirings 19.

Since the side insulating film 24 (for example, an SiN film) and the interlayer insulating film 25 (for example, an $SiO_2$ film) are of different materials, the etching selectivity between them is high. Each contact hole is formed adjacent to the MTJ element MTJ so as to expose the side surface of the side insulating film 24. In this manner, the contact 26 can be formed in self-alignment with the side insulating film 24, write word line WWL, MTJ element MTJ, and hard mask HM.

Figure 9:
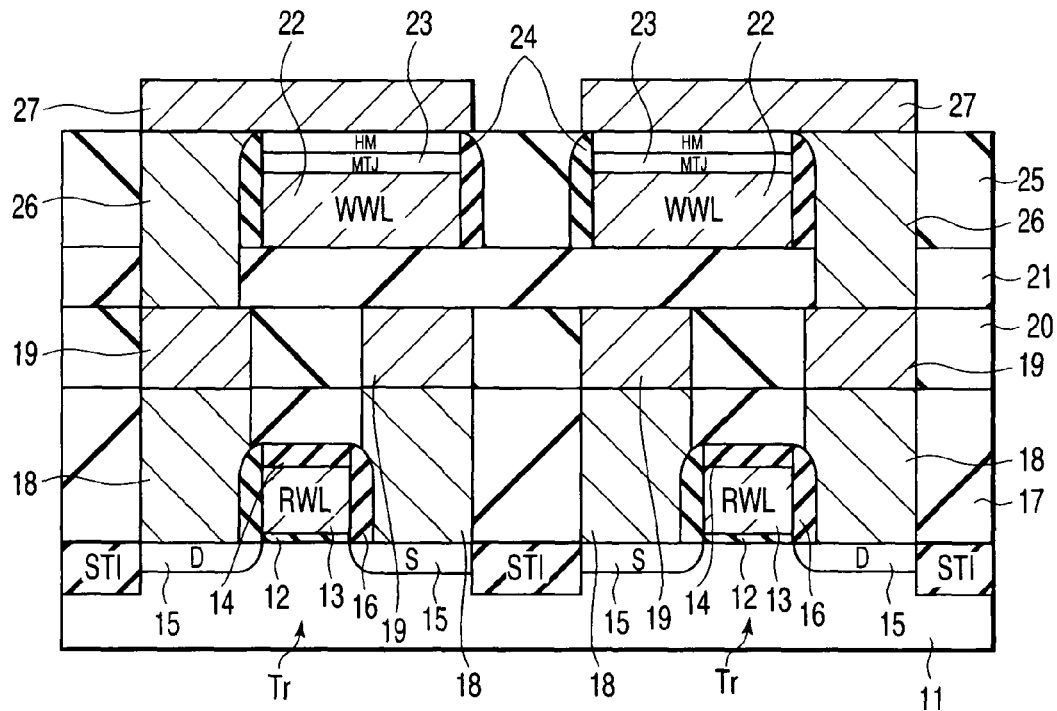

As shown in FIG. 9, a wiring 27 is formed on the hard masks HM and contacts 26, and patterned into a desired shape. The wirings 27 electrically connect the hard masks HM and transistors Tr.

Finally, as shown in FIG. 1, the wirings 27 are buried with an interlayer insulating film 28, and a wiring 29 having a desired shape is formed on the interlayer insulating film 28. The wiring 29 functions as a bit line BL.

[1-2] Modification Example of Magnetic Random Access Memory

Figure 10:
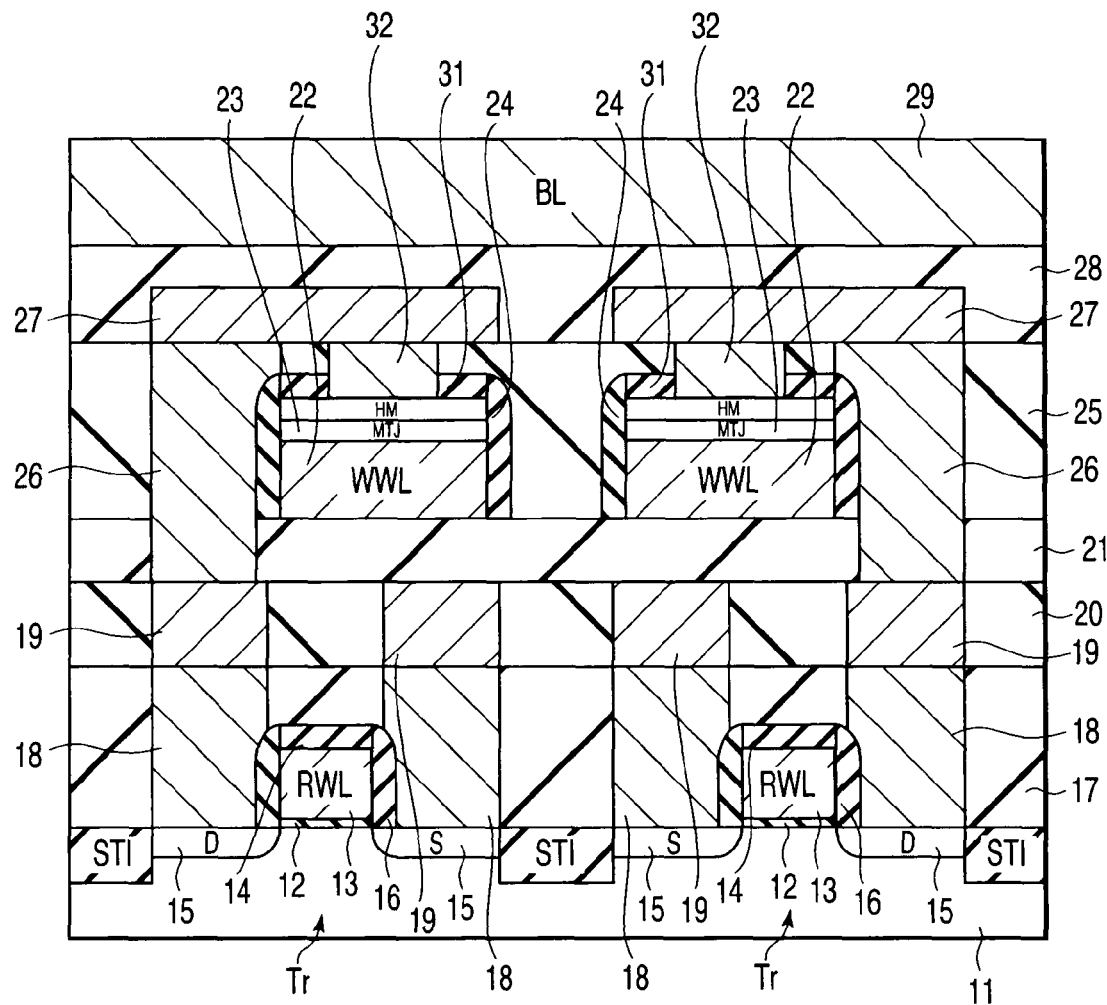
FIG. 10 is a sectional view showing a modification example of the magnetic random access memory according to the first embodiment of the present invention.

FIG. 10 is a sectional view showing a modification example of the magnetic random access memory according to the first embodiment of the present invention. This modification example of the magnetic random access memory according to the first embodiment will be explained below.

As shown in FIG. 10, the hard mask HM and wiring 27 need not be in direct contact with each other, but can also be connected via a contact 32. In this case, a top insulating film 31 is desirably formed on the upper surface of the hard mask HM. This is to protect the hard mask HM and the MTJ element MTJ from being partially etched away during the formation of the contact 26.

The top insulating film 31 and a side insulating film 24 desirably consist of a material that increases the etching selectivity to the interlayer insulating films 21 and 25 around them. Therefore, when the interlayer insulating films 21 and 25 are, for example, $SiO_2$, the top insulating film 31 and side insulating film 24 are preferably, for example, SiN or AlxOy. Note that while the top insulting film 31 and side insulating film 24 are desirably the same material in view of the adhesion of the material and the like, they may also be different materials.

The top insulating film 31 is desirably thicker than the side insulating film 24. This is to allow the top insulating film 31 to adequately protect the upper end portions and the like of the hard mask HM and MTJ element MTJ from being etched away during the formation of the contact 26.

Figure 11:
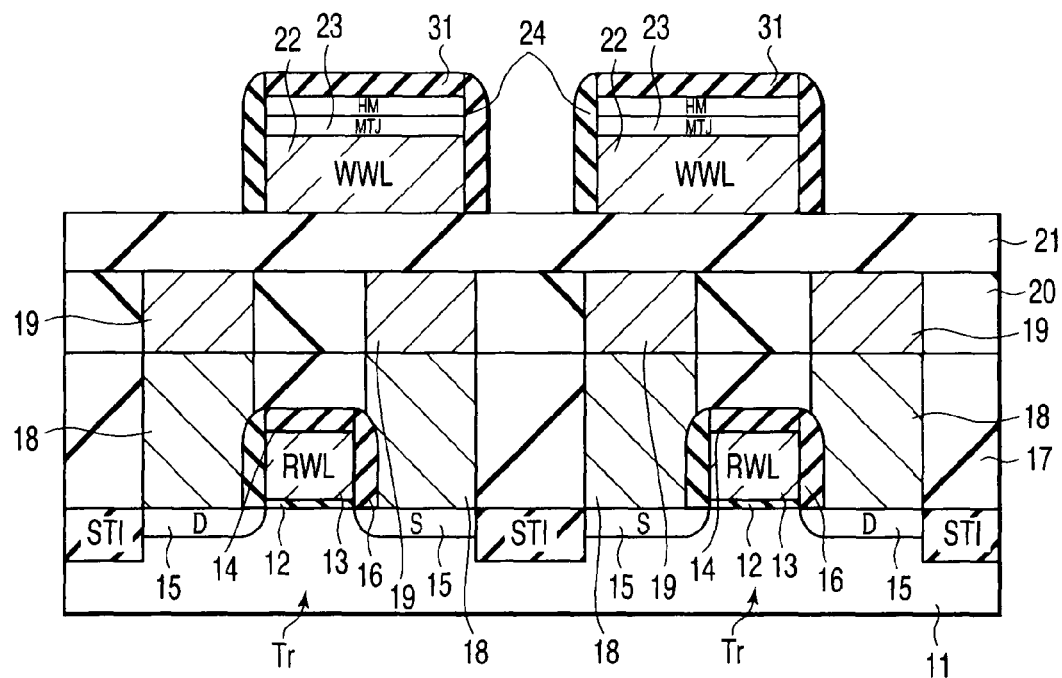
FIG. 11 is a sectional view showing the manufacturing step, following FIG. 5, of the modification example of the magnetic random access memory according to the first embodiment of the present invention.
Figure 12:
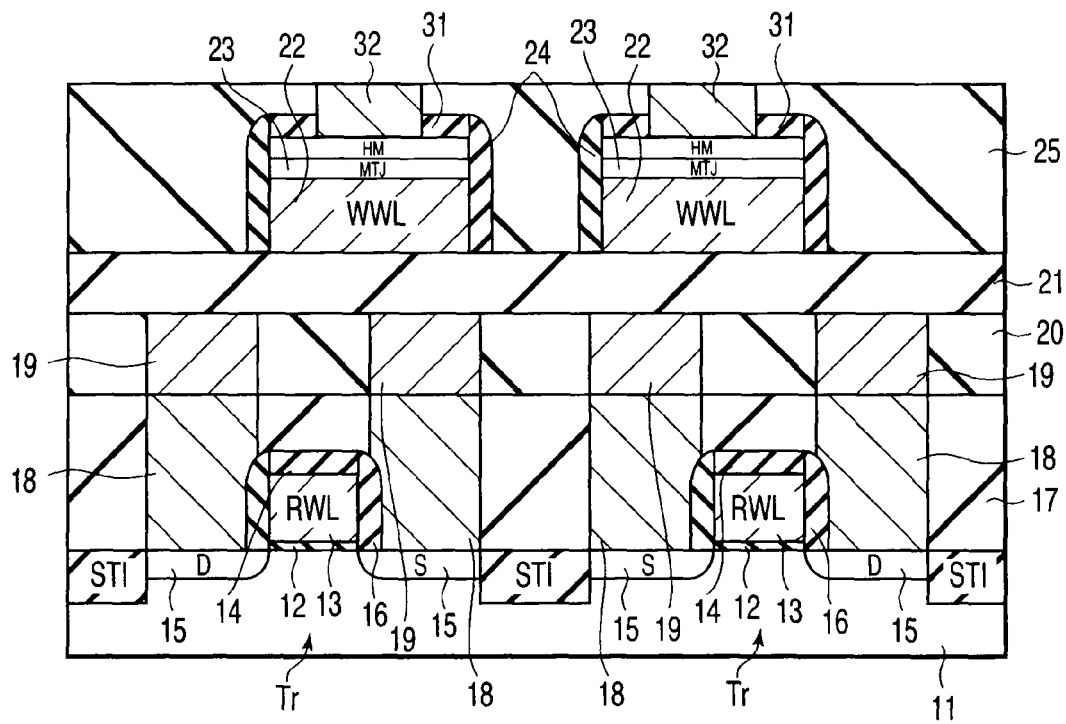
FIG. 12 is a sectional view showing the manufacturing step, following FIG. 11, of the modification example of the magnetic random access memory according to the first embodiment of the present invention.

FIGS. 11 and 12 are sectional views showing the manufacturing steps of the modification example of the magnetic random access memory according to the first embodiment of the present invention. A method of manufacturing the modification example of the magnetic random access memory according to the first embodiment will be explained below.

First, after the steps shown in FIGS. 3 to 5 described above are performed, as shown in FIG. 11, the wirings 19 connecting to the contacts 18 are formed and buried with the interlayer insulating film 20. The interlayer insulating film 20 is then planarized until the wirings 19 are exposed. Subsequently, the interlayer insulating film 21 is formed on the wirings 19 and interlayer insulating film 20. The wiring 22 made of, for example, AlCu is formed on the interlayer insulating film 21. The MTJ element film 23 is formed on the wiring 22, and the hard mask HM is formed on the MTJ element film 23. A top insulating film 31 is formed on the hard mask HM. The top insulating film 31 consists of, for example, SiN. After that, the wiring 22, MTJ element film 23, hard mask HM, and top insulating film 31 are patterned into a desired shape. In this way, the bit lines BL and MTJ elements MTJ are formed. The side insulating films 24 are formed on the side surfaces of the bit lines BL, MTJ elements MTJ, hard masks HM, and top insulating films 31. The side insulating film 24 consists of, for example, SiN.

As shown in FIG. 12, an interlayer insulating film 25 of $SiO_2$ or the like is formed and selectively removed by RIE, and the top insulating films 31 are also selectively removed by RIE. This forms contact holes that expose the hard masks HM. Contacts 32 connecting to the MTJ elements MTJ are formed by burying W or the like in these contact holes. After that, the contacts 26, wirings 27, and a bit line BL are sequentially formed following the same procedures as above.

The modification example as described above can achieve the same effect as in the structure shown in FIG. 1, and can also achieve the following effects by forming the contacts 32. That is, this modification example can make the contact area between the MTJ element MTJ (hard mask HM) and wiring 27 smaller than that in the structure shown in FIG. 1. This alleviates the influence of stress, and facilitates magnetic design. It is also possible to suppress etching damage to the MTJ element MTJ when the wiring 27 is processed.

[1-3] MTJ Element (1) Structure

Figure 13:
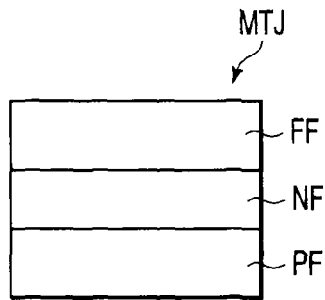
FIG. 13 is a sectional view showing the MTJ element according to the first embodiment of the present invention.

FIG. 13 is a sectional view of the MTJ element according to the first embodiment of the present invention. This MTJ element will be explained below.

As shown in FIG. 13, the MTJ element MTJ has a fixed layer PF in which magnetization is fixed in one axial direction, a recording layer FF in which magnetization reverses, a nonmagnetic layer NF sandwiched between the fixed layer PF and recording layer FF, and an antiferromagnetic layer (not shown) that fixes magnetization in the fixed layer PF.

Each of the fixed layer PF and recording layer FF is not limited to a single layer as shown in FIG. 13. For example, each of the fixed layer PF and recording layer FF may also be a stacked film made up of a plurality of ferromagnetic layers. At least one of the fixed layer PF and recording layer FF can have an antiferromagnetic coupling structure which includes three layers, i.e., a first ferromagnetic layer/nonmagnetic layer/second ferromagnetic layer, and in which the first and second ferromagnetic layers magnetically couple with each other (interlayer exchange coupling) such that the magnetization directions in these layers are antiparallel, or a ferromagnetic coupling structure in which the first and second ferromagnetic layers magnetically couple with each other (interlayer exchange coupling) such that the magnetization directions in these layers are parallel.

The nonmagnetic layer NF is not limited to a single-junction structure including one nonmagnetic layer as shown in FIG. 13. For example, the MTJ element MTJ may also have a double-junction structure having two nonmagnetic layers. The MTJ element MTJ having this double-junction structure has a first fixed layer, a second fixed layer, a recording layer formed between the first and second fixed layers, a first nonmagnetic layer formed between the first fixed layer and recording layer, and a second nonmagnetic layer formed between the second fixed layer and recording layer.

The planar shape of the MTJ element MTJ is not limited to a rectangle and can be variously changed. Examples are an ellipse, circle, hexagon, rhomb, parallelogram, cross, and bean (recessed shape). To decrease the cell size, however, the planar shape of the MTJ element MTJ is preferably a rectangle of F (short side)×2F (long side).

The fixed layer PF, nonmagnetic layer NF, and recording layer FF of the MTJ element MTJ are simultaneously processed to have the same planar shape. However, the present invention is not limited to this embodiment. For example, it is also possible to give the fixed layer PF and nonmagnetic layer NF a rectangular shape and only the recording layer FF a cross shape.

(2) Materials

The following ferromagnetic materials are used as the materials of the fixed layer PF and recording layer FF. Favorable examples are Fe, Co, Ni, and their stacked films and alloys, magnetite having a high spin polarization ratio, oxides such as $CrO_2$ and $RXMnO_{3-y}$ (R; rare earth element, X; Ca, Ba, and Sr), and Heusler alloys such as NiMnSb and PtMnSb. These magnetic materials can more or less contain nonmagnetic elements such as Ag, Cu, Au, Al, Mg, Si, Bi, Ta, B, C, O, N, Pd, Pt, Zr, Ir, W, Mo, and Nb, provided that the materials do not loose ferromagnetism.

As the material of the nonmagnetic layer NF, it is possible to use various dielectrics such as $Al_2O_3$, $SiO_2$, MgO, AlN, $Bi_2O_3$, $MgF_2$, $CaF_2$, $SrTiO_2$, and $AlLaO_3$. These dielectrics may have oxygen, nitrogen, and fluorine deficiencies.

When an insulator such as MgO (magnesium oxide) or AlO (aluminum oxide, for example, $Al_2O_3$) is used as the nonmagnetic layer NF, the MTJ element MTJ has the TMR (Tunneling Magneto Resistive) effect. When a metal such as Cu or Pt is used as the nonmagnetic layer NF, the MTJ element MTJ has the GMR (Giant Magneto Resistive) effect.

(3) Magnetization Arrangement

FIGS. 14A, 14B, 15A, and 15B are views showing parallel and antiparallel magnetization arrangements of the MTJ element according to the first embodiment of the present invention.

Figures 14A, 14B:
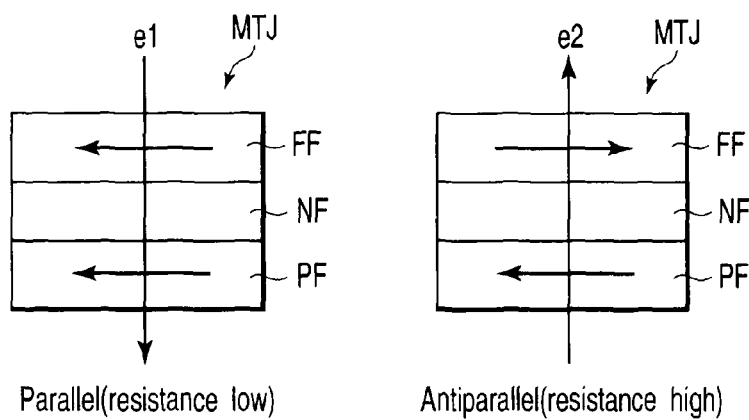
FIG. 14A is a view showing the parallel arrangement of a parallel magnetization type MTJ element according to the first embodiment of the present invention.
FIG. 14B is a view showing the antiparallel arrangement of the parallel magnetization type MTJ element according to the first embodiment of the present invention.
Figures 15A, 15B:
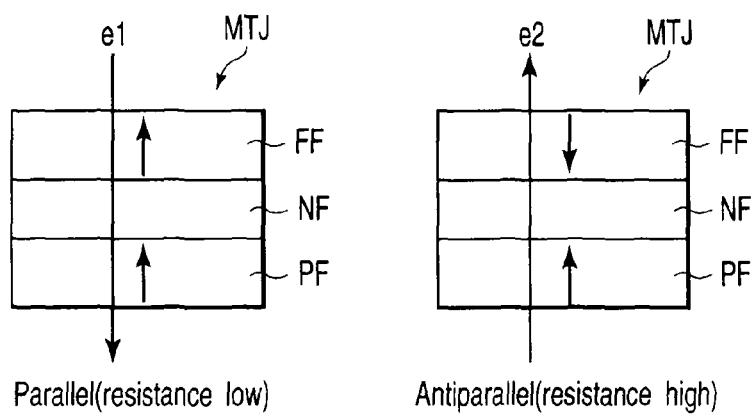
FIG. 15A is a view showing the parallel arrangement of a perpendicular magnetization type MTJ element according to the first embodiment of the present invention.
FIG. 15B is a view showing the antiparallel arrangement of the perpendicular magnetization type MTJ element according to the first embodiment of the present invention.

As shown in FIGS. 14A and 15A, the tunnel resistance of the nonmagnetic layer NF is a minimum when the magnetization directions in the fixed layer PF and recording layer FF of the MTJ element MTJ are parallel (the same). This state is regarded as, for example, a "1" state.

On the other hand, as shown in FIGS. 14B and 15B, the tunnel resistance of the nonmagnetic layer NF is a maximum when the magnetization directions in the fixed layer PF and recording layer FF of the MTJ element MTJ are antiparallel (opposite). This state is regarded as, for example, a "0" state.

Note that the magnetization stabilizing directions in the fixed layer PF and recording layer FF can be a parallel magnetization type, i.e., parallel to the film surface as shown in FIGS. 14A and 14B, or a perpendicular magnetization type, i.e., perpendicular to the film surface as shown in FIGS. 15A and 15B.

[1-4] Write Method (1) Magnetic Field Write

When using magnetic field write as a write method, data write to the MTJ element MTJ is performed as follows.

A bit line BL and write word line WWL corresponding to the MTJ element MTJ of a selected cell are selected, and write currents are supplied to the selected bit line BL and write word line WWL. A synthetic magnetic field generated by the write currents is applied to the MTJ element MTJ to make the magnetization directions in the MTJ element MTJ parallel or antiparallel.

For example, the write current in the bit line BL flows in one direction, and the write current in the write word line WWL flows in both directions. In this case, the magnetization direction in the recording layer of the MTJ element MTJ is changed by changing the direction of the write current flowing through the write word line WWL. Note that the write current in the bit line BL may also flow in both directions.

(2) Spin-Transfer Write

Spin-transfer write will be explained below with reference to FIGS. 14A and 14B. Note that the flow directions of electrons e1 and e2 are of course opposite to those of electric currents.

First, as shown in FIG. 14A, when the write current is supplied from the fixed layer PF to the recording layer FF, electrons that are spin-polarized (to be referred to as spin-polarized electrons hereinafter) e1 flow from the recording layer FF to the fixed layer PF. Electrons having spins parallel to the fixed layer PF are transmitted through it, and electrons having spins antiparallel to the fixed layer PF are reflected by it. Consequently, the magnetization directions in the recording layer FF and fixed layer PF form an antiparallel magnetization arrangement.

On the other hand, as shown in FIG. 14B, when the write current is supplied from the recording layer FF to the fixed layer PF, spin-polarized electrons e2 are injected from the fixed layer PF into the recording layer FF. As a consequence, the magnetization directions in the fixed layer PF and recording layer FF form a parallel magnetization arrangement.

Note that data write to the MTJ element MTJ can also be performed by combining (1) magnetic field write and (2) spin-transfer write.

[1-5] Read Method

Data read from the MTJ element MTJ is performed by applying a voltage (or current) between the write word line WWL and read word line RWL, and detecting a current (or voltage) by a sense amplifier (not shown), thereby determining whether the MTJ element MTJ is in the "1" or "0" state.

The resistance is low if the magnetization arrangement in the MTJ element MTJ is parallel (for example, the "1" state), and high if the magnetization arrangement is antiparallel (for example, the "0" state). Accordingly, whether the MTJ element is "1" or "0" can be determined by reading the difference between these resistance values.

[1-6] Effect

The first embodiment described above forms the contact 26, which connects the MTJ element MTJ and switching element, in self-alignment with the write word line WWL and MTJ element MTJ, thereby implementing the structure in which the contact 26 is in direct contact with the side insulating film 24 of the write word line WWL and MTJ element MTJ. That is, the first embodiment can decrease the cell size because the contact 26 that connects the MTJ element MTJ and MOS transistor Tr can be formed adjacent to the MTJ element MTJ. More specifically, as shown in FIG. 2A, letting F (Feature size) be the short side (the width in the magnetic hard axis direction) of the MTJ element MTJ and 2F be the long side (the width in the magnetic easy axis direction), a cell of $2F \times 4F = 8F^2$ can be implemented. This makes it possible to decrease the cell size.

[2] Second Embodiment

In the first embodiment, the contact connecting to the switching element is formed beside an MTJ element. The second embodiment further decreases the cell size by forming a contact connecting to a switching element below the MTJ element.

[2-1] Basic Example of Magnetic Random Access Memory

Figure 16:
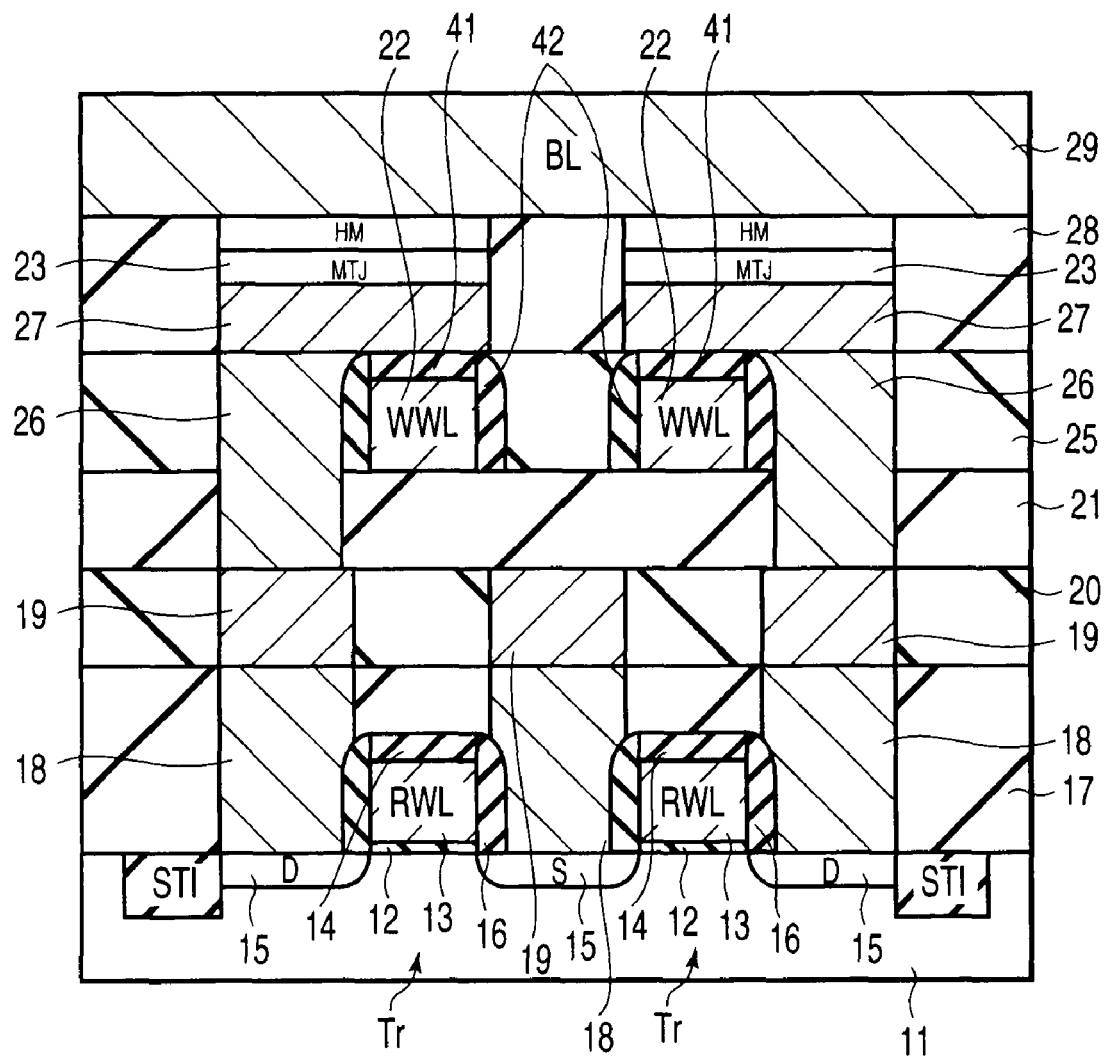
FIG. 16 is a sectional view showing a basic example of a magnetic random access memory according to the second embodiment of the present invention.
Figure 17A:
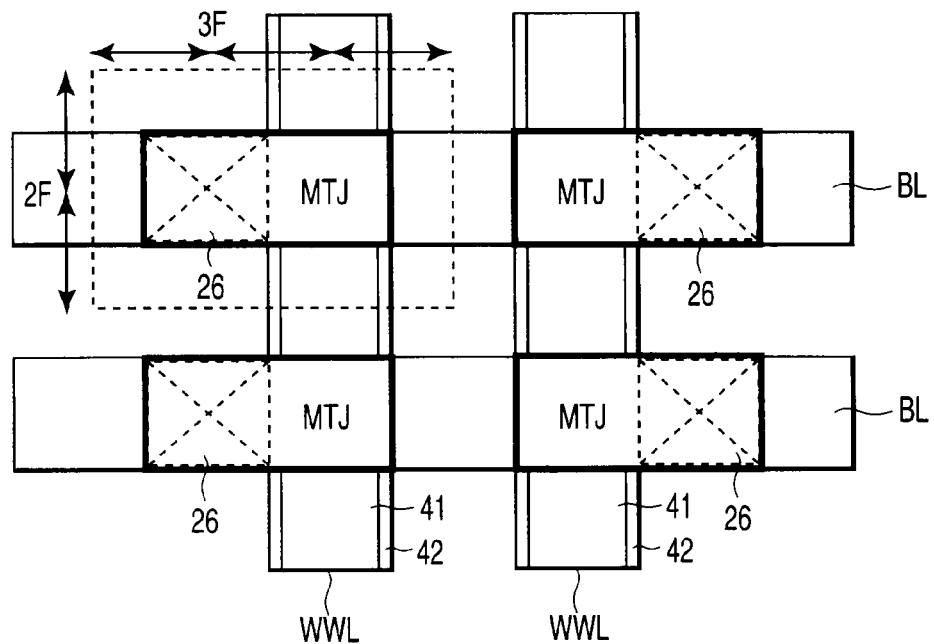
FIG. 17A is a plan view showing the periphery of an MTJ element according to the second embodiment of the present invention.
Figure 17B:
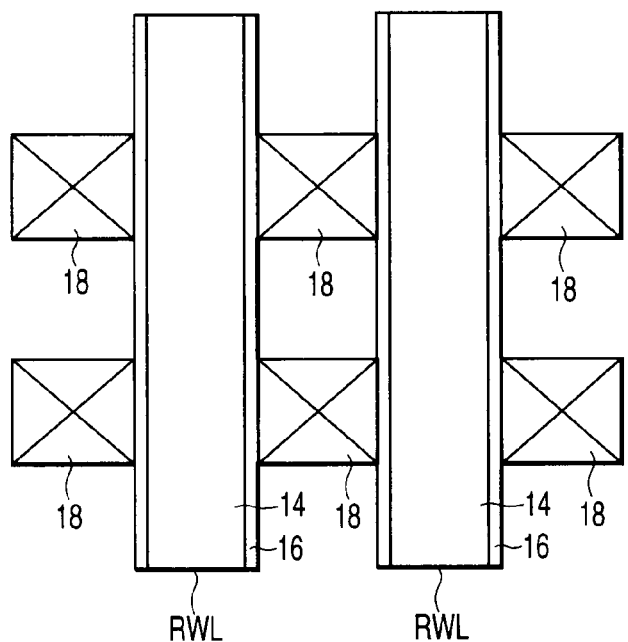
FIG. 17B is a plan view showing the periphery of a gate electrode according to the second embodiment of the present invention.

FIG. 16 is a sectional view showing a basic example of a magnetic random access memory according to the second embodiment of the present invention. FIG. 17A is a plan view showing the periphery of an MTJ element according to the second embodiment of the present invention. FIG. 17B is a plan view showing the periphery of a gate electrode according to the second embodiment of the present invention. The basic example of the magnetic random access memory according to the second embodiment will be explained below.

As shown in FIG. 16, the difference of the second embodiment from the first embodiment is the peripheral structure of an MTJ element MTJ explained below.

A wiring 27 is formed on a contact 26 connecting to a source/drain diffusion layer 15 of a MOS transistor Tr. The MTJ element MTJ is formed in contact with the upper surface of the wiring 27. The MTJ element MTJ has the same planar shape as the wiring 27. The side surfaces in the magnetic easy axis direction of the MTJ element MTJ are aligned with the side surfaces in the magnetic easy axis direction of the wiring 27, and the side surfaces in the magnetic hard axis direction of the MTJ element MTJ are aligned with the side surfaces in the magnetic hard axis direction of the wiring 27. A hard mask HM is formed on the MTJ element MTJ, and a bit line BL is formed on the hard mask HM.

A write word line WWL is formed below the MTJ element MTJ so as to be spaced apart from the wiring 27. Side insulating films 42 are formed on the side surfaces in the magnetic easy axis direction of the write word line WWL, and a top insulating film 41 is formed on the upper surface of the write word line WWL. The contact 26 is formed in self-alignment with the write word line WWL and side insulating film 42. Therefore, the contact 26 is in direct contact with the side insulating film 42. A portion of the contact 26 covers the upper portion of the side insulating film 42.

Adjacent MOS transistors Tr share a source contact 18 of contacts 18 connected to the source/drain diffusion layers 15 of the MOS transistors Tr. Accordingly, the distance between adjacent gate electrodes 13 is about the sum of the width of the contact 18 and the film thickness of a side insulating film 16.

The material of the side insulating film 42 and top insulating film 41 is desirably different from that of an interlayer insulating film 25. This is to increase the etching selectivity between the two materials during the formation of the contact 26. For example, when the interlayer insulating film 25 is $SiO_2$, the side insulating film 42 and top insulating film 41 are preferably SiN or AlxOy. Note that the top insulating film 41 and side insulating film 42 are desirably the same material in view of the adhesion of the material and the like, but they may also be different materials.

The thickness Ts2 of the side insulating film 42 is, for example, about 10 to 50 nm. The thickness Ts2 of the side insulating film 42 can be less than the thickness Tt2 of the top insulating film 41. For example, it is favorable to satisfy $Tt2 \times \frac{1}{3} \leq Ts2 \leq Tt2 \times \frac{1}{2}$. The lower limit is mainly defined on the basis of the etching selectivity during the formation of the contact 26 and the insulation breakdown voltage. The upper limit is defined so as to ensure a minimum necessary width of the contact hole (particularly, the side width of the contact hole) when the contact 26 is formed by etching.

FIGS. 18 to 22 are sectional views showing the manufacturing steps of the basic example of the magnetic random access memory according to the second embodiment of the present invention. A method of manufacturing the basic example of the magnetic random access memory according to the second embodiment will be explained below.

First, contacts 18 are formed in self-alignment with side insulating films 16 and gate electrodes 13 through the steps shown in FIGS. 3 to 5 described previously.

Figure 18:
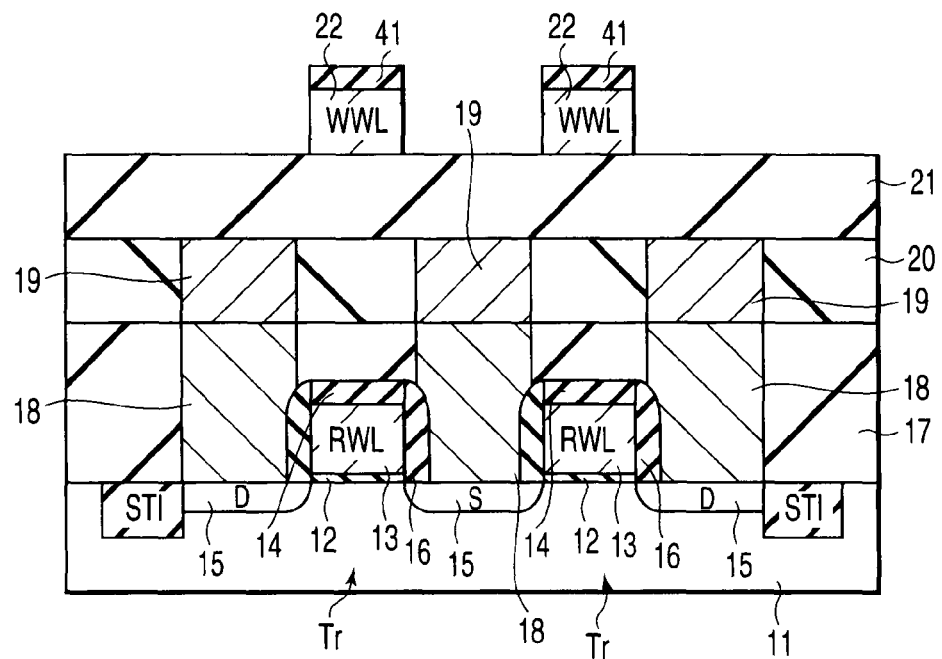
FIGS. 18 to 22 are sectional views showing the manufacturing steps of the basic example of the magnetic random access memory according to the second embodiment of the present invention.

As shown in FIG. 18, wirings 19 connecting to the contacts 18 are formed and buried with an interlayer insulating film 20. The interlayer insulating film 20 is then planarized until the wirings 19 are exposed. Subsequently, an interlayer insulating film 21 of $SiO_2$ or the like is formed on the wirings 19 and interlayer insulating film 20. A wiring 22 made of, for example, AlCu is formed on the interlayer insulating film 21. A top insulating film 41 of, for example, SiN is formed on the wiring 22. After that, the wiring 22 and top insulating film 41 are patterned into a desired shape, thereby forming write word lines WWL.

Figure 19:
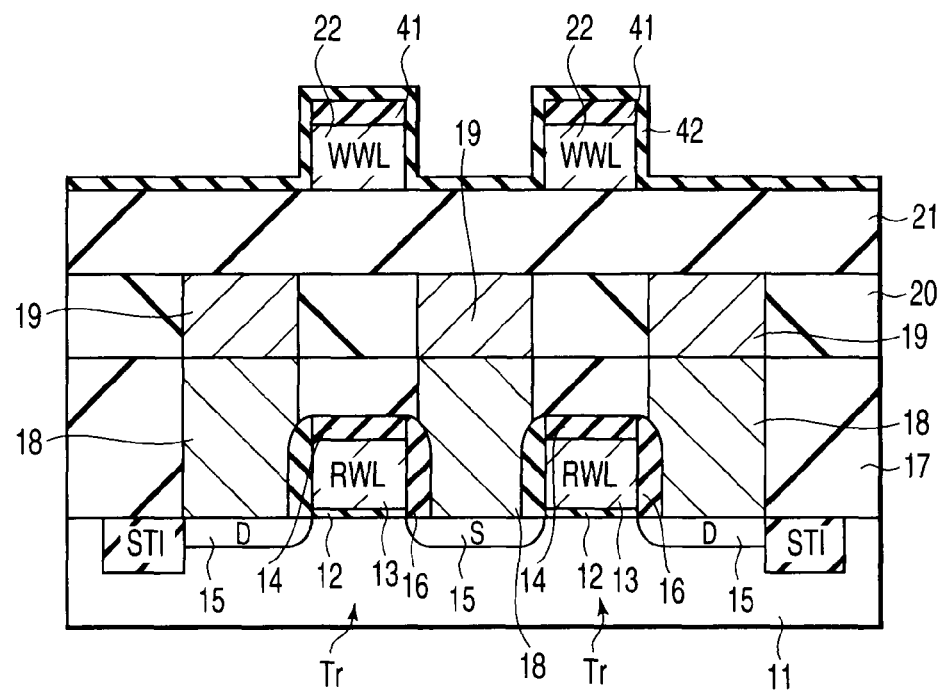

As shown in FIG. 19, a side insulating film 42 is formed on the top insulating films 41 and interlayer insulating film 21. The side insulating film 42 is, for example, SiN.

Figure 20:
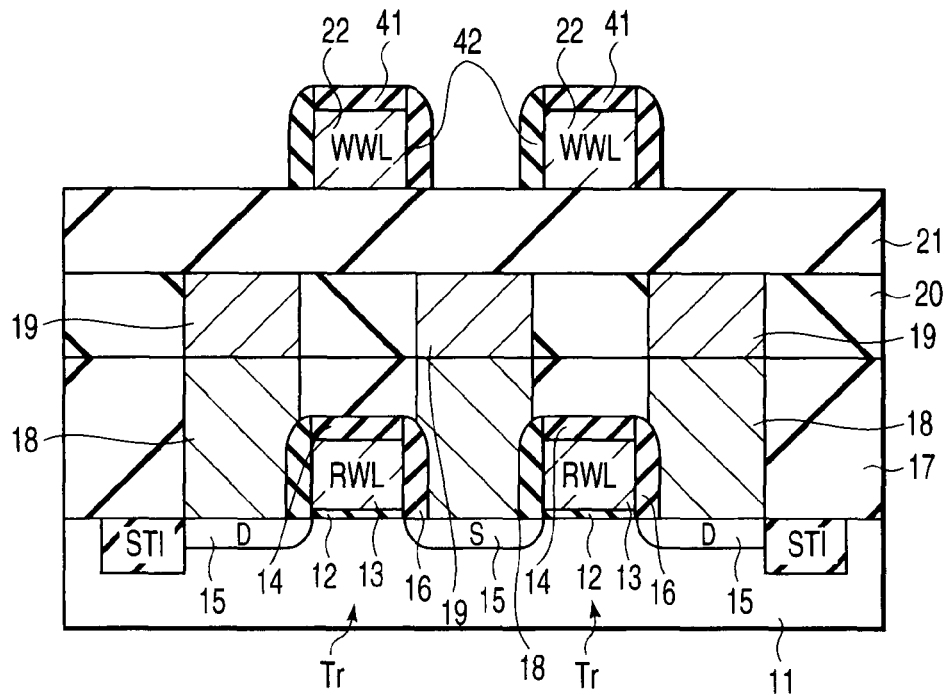

As shown in FIG. 20, the side insulating film 42 is selectively removed by RIE or the like and left behind on the side surfaces of write word lines WWL and top insulating films 41.

Figure 21:
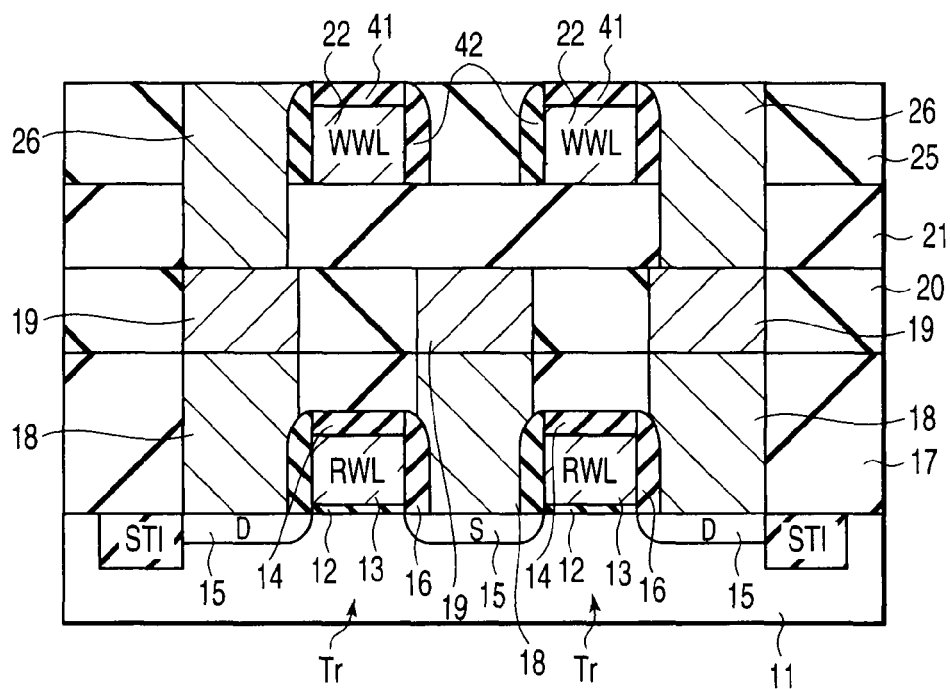

As shown in FIG. 21, an interlayer insulating film 25 is formed on the top insulating films 41, side insulating films 42, and interlayer insulating film 21, thereby covering the top insulating films 41. The interlayer insulating film 25 is, for example, $SiO_2$. The interlayer insulating film 25 is then planarized by CMP or the like to expose the top insulating films 41. In this step, the interlayer insulating film 25 may sometimes partially remain on the top insulating films 41. Subsequently, contact holes are formed in the interlayer insulating films 21 and 25 by RIE or the like, thereby partially exposing the side insulating films 42. Contacts 26 are formed by burying W or the like in the contact holes. The contacts 26 are connected to the wirings 19.

Since the top insulating film 41 and side insulating film 42 (for example, SiN films) and the interlayer insulating films 21 and 25 (for example, $SiO_2$ films) are different materials, the etching selectivity between them is high. Each contact hole is formed adjacent to the write word line WWL so as to expose the side surface of the side insulating film 42. In this manner, the contact 26 can be formed in self-alignment with the side insulating film 42 and write word line WWL.

Figure 22:
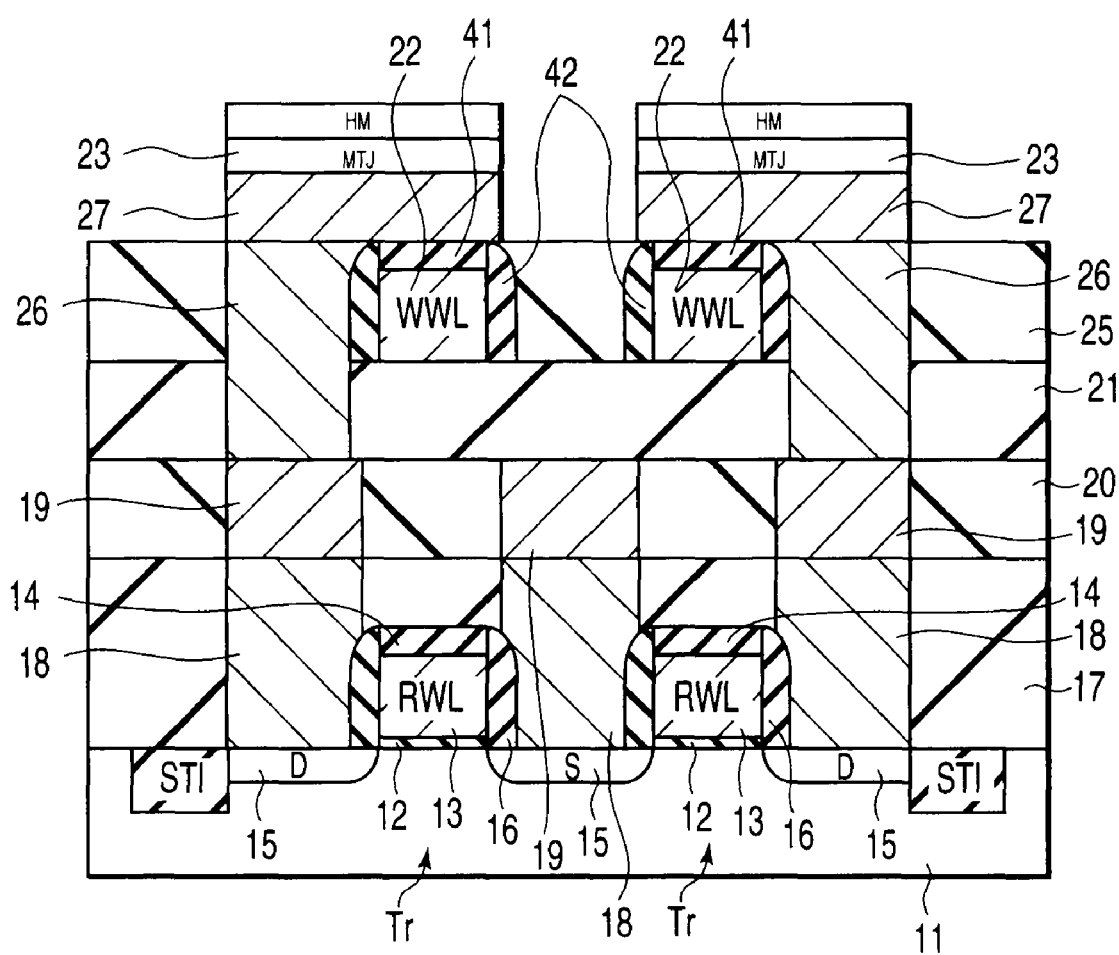

As shown in FIG. 22, a wiring 27 is formed on the contacts 26 and interlayer insulating film 25, and an MTJ element film 23 is formed on the wiring 27. A hard mask HM is formed on the MTJ element film 23 and patterned. After that, the wiring 27 and MTJ element film 23 are patterned into a desired shape. This forms wirings 27 and MTJ elements MTJ having the same planar shape.

Finally, as shown in FIG. 16, the MTJ elements MTJ are buried with an interlayer insulating film 28, and the interlayer insulating film 28 is planarized until the hard masks HM are exposed. Subsequently, a wiring 29 having a desired shape is formed on the interlayer insulating film 28 and MTJ elements MTJ. The wiring 29 functions as a bit line BL.

[2-2] Modification Examples of Magnetic Random Access Memory (1) Modification Example 1

FIG. 23 is a sectional view showing modification example 1 of the magnetic random access memory according to the second embodiment. Modification example 1 of the magnetic random access memory according to the second embodiment will be explained below.

As shown in FIG. 23, modification example 1 forms the write word line WWL by the damascene process. Therefore, while the side insulating films 42 are formed on only the side surfaces of the write word line WWL in the structure shown in FIG. 16, an insulating film 52 formed on the side surfaces of the write word line WWL is also formed on the bottom surface of the write word line WWL in the structure shown in FIG. 23.

In the structure shown in FIG. 23, a barrier metal film 53 is desirably formed between the write word line WWL and insulating film 52 in order to ensure the reliability of a wiring. However, the barrier metal film 53 need not always be formed. A top insulating film 54 is formed on the write word line WWL, barrier metal film 53, and insulating film 52. The upper surface of the top insulating film 54 and that of the contact 26 are in direct contact with the bottom surface of the wiring 27.

The contact 26 is formed in self-alignment with the insulating film 52 and a bit line BL. Therefore, the side surface of the contact 26 is in direct contact with that of the insulating film 52.

The top insulating film 54 and insulating film 52 are desirably a material which increases the etching selectivity to an interlayer insulating film 51 around them. Accordingly, when the interlayer insulating film 51 is, for example, $SiO_2$, the top insulating film 54 and insulating film 52 are preferably, for example, SiN films, AlxOy films, stacked films of SiN/Ta/NiFe/Ta, or FexOy films.

The top insulating film 54 is desirably thicker than the insulating film 52. This is to allow the top insulating film 54 to adequately protect the upper end portions and the like of the write word line WWL from being etched away during the formation of the contact 26.

FIGS. 24 to 28 are sectional views showing the manufacturing steps of modification example 1 of the magnetic random access memory according to the second embodiment of the present invention. A method of manufacturing modification example 1 of the magnetic random access memory according to the second embodiment will be explained below. Although the damascene process of the write word line WWL will be explained, other manufacturing steps are the same as those of the basic example of the magnetic random access memory according to the second embodiment described above.

Figure 24:
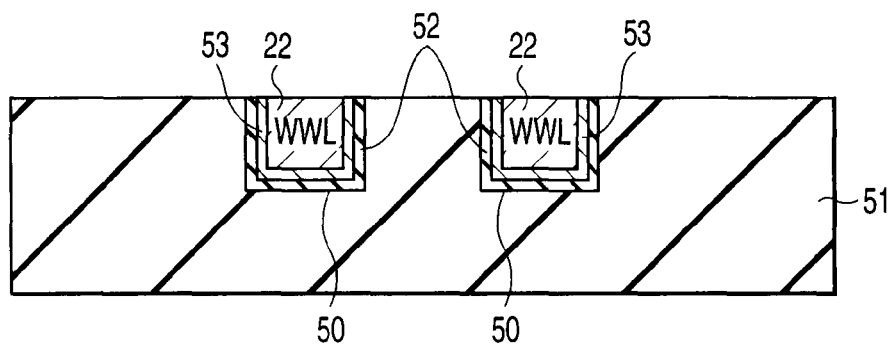
FIGS. 24 to 28 are sectional views showing the manufacturing steps of modification example 1 of the magnetic random access memory according to the second embodiment of the present invention.

First, as shown in FIG. 24, trenches 50 are formed in an interlayer insulating film 51 of, for example, SiO$_2$ by selectively removing it by RIE or the like. An insulating film 52 is formed in the trenches 50 and on the interlayer insulating film 51. A barrier metal film 53 is formed on the insulating film 52. The insulating film 52 is, for example, SiN, and the barrier metal film 53 is a Ta-based material such as TaN. A wiring 22 made of Cu or the like is formed on the barrier metal film 53. After that, the wiring 22, barrier metal film 53, and insulating film 52 are planarized by CMP or the like, thereby exposing the interlayer insulating film 51.

Figure 25:
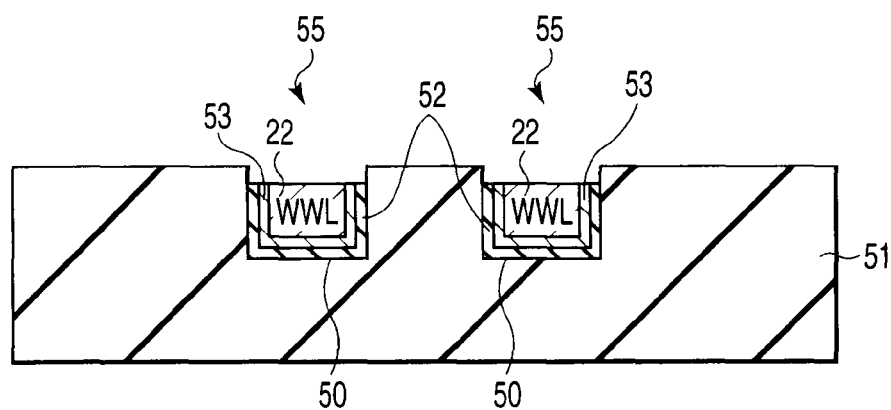

Then, as shown in FIG. 25, a recess 55 is formed in the upper portion of each trench 50 by removing the upper portions of the wiring 22, barrier metal film 53, and insulating film 52.

Figure 26:
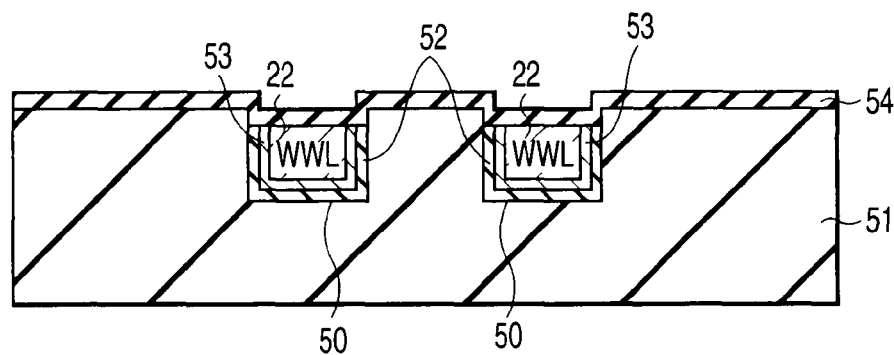

As shown in FIG. 26, a top insulting film 54 is formed on the recesses 55 and interlayer insulating film 51. The top insulating film 54 is, for example, SiN.

Figure 27:
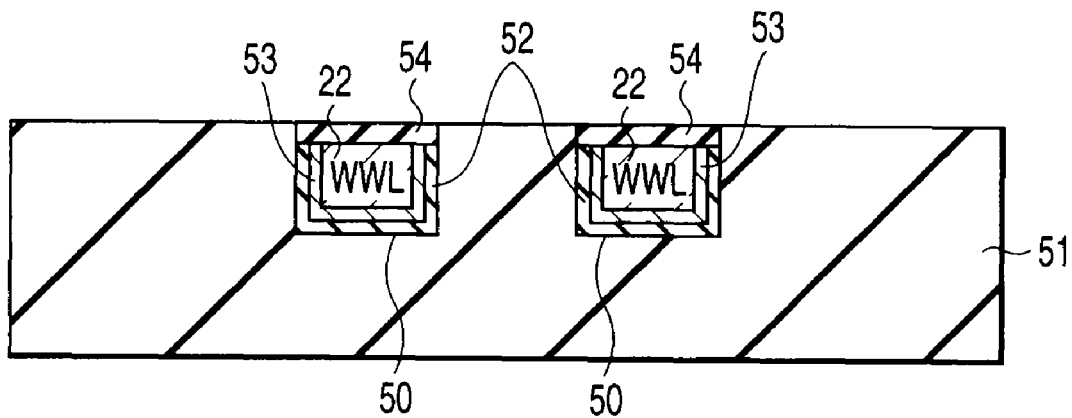

As shown in FIG. 27, the top insulating film 54 on the interlayer insulating film 51 is removed by CMP or the like, and left behind in only the recesses 55.

Figure 28:
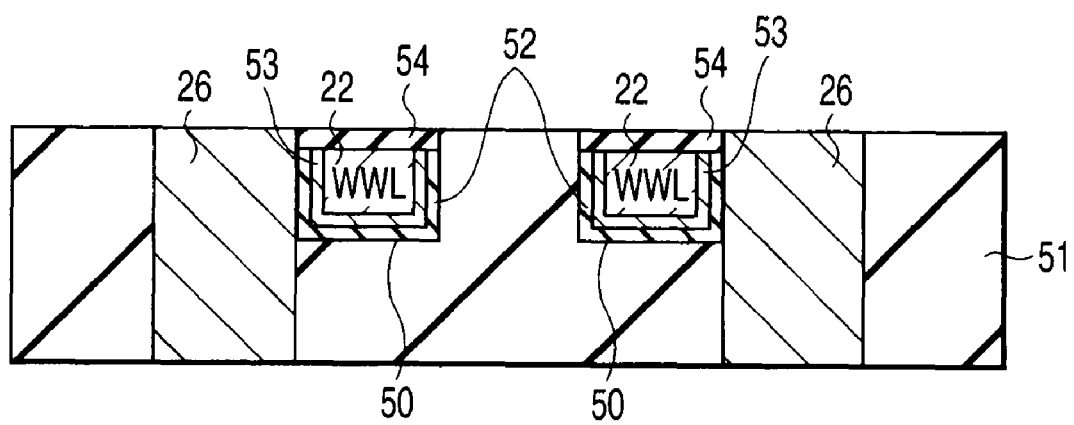

As shown in FIG. 28, contact holes are formed in the interlayer insulating film 51 by RIE or the like, and contacts 26 are formed by burying, for example, W in these contact holes. The contacts 26 are connected to wirings 19 (not shown).

Since the top insulating film 54 (for example, an SiN film) and insulating film 52 (for example, an SiN film) and the interlayer insulating film 51 (for example, an SiO$_2$ film) are different materials, the etching selectivity between them is high. Each contact hole is formed adjacent to a write word line WWL so as to expose the side surface of the insulating film 52. In this manner, the contact 26 can be formed in self-alignment with the insulating film 52 and write word line WWL.

As described above, modification example 1 forms the write word line WWL by the damascene process. This makes the MTJ element MTJ and write word line WWL closer to each other than in FIG. 16. Accordingly, the write current in the write word line WWL can be reduced.

(2) Modification Example 2

Figure 29:
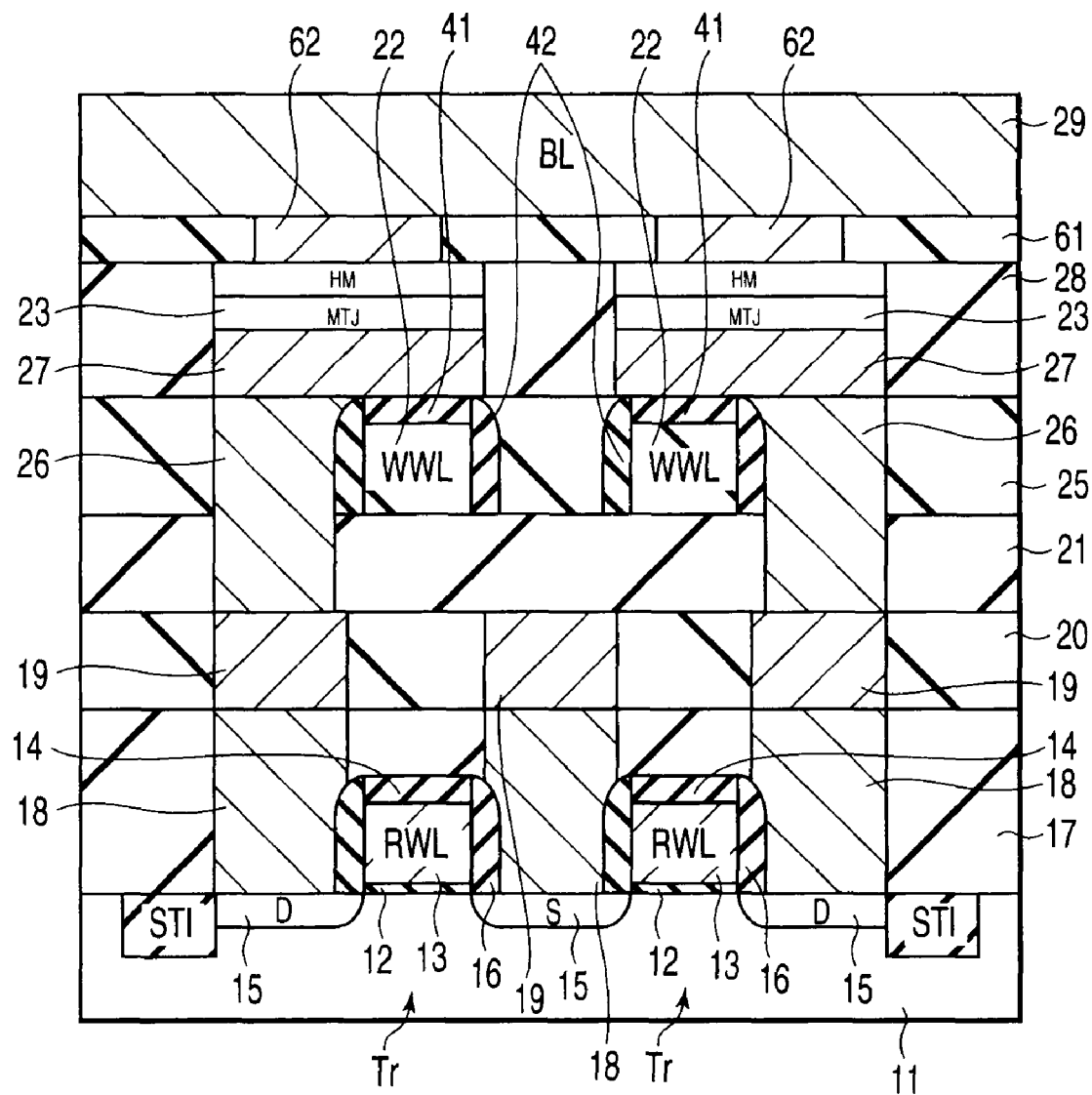
FIG. 29 is a sectional view showing modification example 2 of the magnetic random access memory according to the second embodiment of the present invention.

FIG. 29 is a sectional view of modification example 2 of the magnetic random access memory according to the second embodiment of the present invention. Modification example 2 of the magnetic random access memory according to the second embodiment will be explained below.

As shown in FIG. 29, the hard mask HM and bit line BL need not be in direct contact with each other, but may also be connected via a contact 62. The contact 62 can be formed by forming a contact hole in an interlayer insulating film 61, and burying a metal material in this contact hole.

Note that the contact hole 62 and bit line BL need not always be formed by separately burying metal materials. For example, the contact 62 and bit line BL can also be formed by forming a contact hole of the contact 62 and a trench of the bit line BL, and simultaneously burying a metal material in these contact hole and trench.

Modification example 2 as described above can achieve the same effect as the structure shown in FIG. 16, and can also achieve the following effects by the formation of the contact 62. That is, modification example 2 can make the contact area between the MTJ element MTJ (hard mask HM) and bit line BL smaller than that in the structure shown in FIG. 16. This alleviates the influence of stress, and facilitates magnetic design. It is also possible to suppress etching damage to the MTJ element MTJ when the bit line BL is processed.

[2-3] MTJ Element

The MTJ element MTJ according to the second embodiment is the same as that according to the first embodiment described previously, so an explanation thereof will be omitted.

[2-4] Write Method

Similar to the write method according to the first embodiment, a write method according to the second embodiment uses one of magnetic field write and spin-transfer write.

The second embodiment differs from the first embodiment in the arrangement of the bit line BL and write word line WWL.

In the first embodiment, as shown in FIG. 2A, the bit line BL runs in the magnetic hard axis direction of the MTJ element MTJ, and the write word line WWL runs in the magnetic easy axis direction of the MTJ element MTJ. Since a write line running in the magnetic hard axis direction of the MTJ element MTJ is the bit line BL, therefore, a write current supplied to the bit line BL produces a magnetic field in the magnetic easy axis direction of the MTJ element MTJ. So, this write current in the bit line BL desirably flows in both directions.

On the other hand, in the second embodiment, as shown in FIG. 17A, the write word line WWL runs in the magnetic hard axis direction of the MTJ element MTJ, and the bit line BL runs in the magnetic easy axis direction of the MTJ element MTJ. Since a write line running in the magnetic hard axis direction of the MTJ element MTJ is the write word line WWL, therefore, a write current supplied to the write word line WWL produces a magnetic field in the magnetic easy axis direction of the MTJ element MTJ. So, this write current in the write word line WWL desirably flows in both directions.

[2-5] Read Method

A read method according to the second embodiment is the same as the read method according to the first embodiment described above, so an explanation thereof will be omitted.

[2-6] Effect

The second embodiment described above forms the contact 26, which connects the MTJ element MTJ and switching element, and the write word line WWL in a region below the MTJ element MTJ. Also, the second embodiment forms the contact 26 in self-alignment with the write word line WWL, thereby implementing the structure in which the contact 26 is in direct contact with the side insulating film 42 of the write word line WWL. That is, the second embodiment can decrease the cell size because the contact 26 that connects the MTJ element MTJ and MOS transistor Tr can be formed adjacent to the write word line WWL. More specifically, as shown in FIG. 17A, letting F be the short side (the width in the magnetic hard axis direction) of the MTJ element MTJ and 2F be the long side (the width in the magnetic easy axis direction), a cell of 2F×3F=6F² can be implemented. This makes it possible to make the cell size smaller than that in the first embodiment.

[3] Third Embodiment

In the third embodiment, the side insulating films and the like in the first and second embodiments are magnetic insulating films. For example, a magnetic insulating material is used to form the side insulating films 24 shown in FIGS. 1 and 10, the side insulating films 42 shown in FIGS. 16 and 29, and the insulating film 52 shown in FIG. 23.

Examples of this magnetic insulating material are insulating ferrite, and (Fe, Co)—(B, Si, Hf, Zr, Sm, Ta, Al)—(F, O, N)-based metal-nonmetal nano-granular films. More specifically, the insulating ferrite is at least one of Mn—Zn-ferrite, Ni—Zn-ferrite, MnFeO, CuFeO, FeO, and NiFeO.

The third embodiment described above can achieve the same effects as the first and second embodiments.

In addition, in the third embodiment, a magnetic insulating film covers the side surfaces of a bit line BL or write word line WWL. This magnetic insulating film achieves the effect as a yoke, and makes it possible to efficiently apply to a selected cell a current magnetic field generated by the bit line BL or write word line WWL. Since this reduces the write current, the power consumption can be reduced.

Also, since the magnetic insulating film covers the side surfaces of the bit line BL or write word line WWL, it is possible to more efficiently interrupt a leakage magnetic field to an adjacent MTJ element MTJ. This suppresses write errors.

Figure 30:
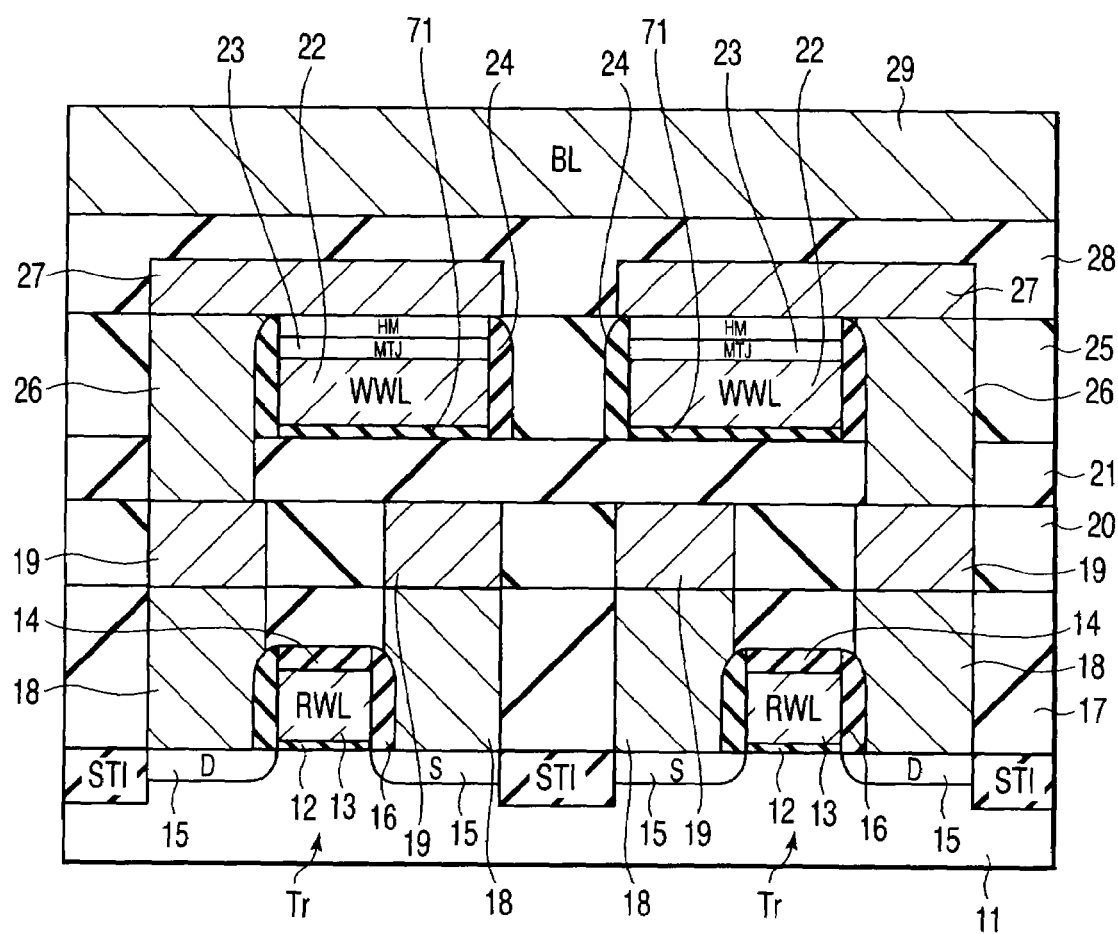
FIG. 30 is a sectional view showing a magnetic random access memory according to the third embodiment of the present invention.
Figure 31:
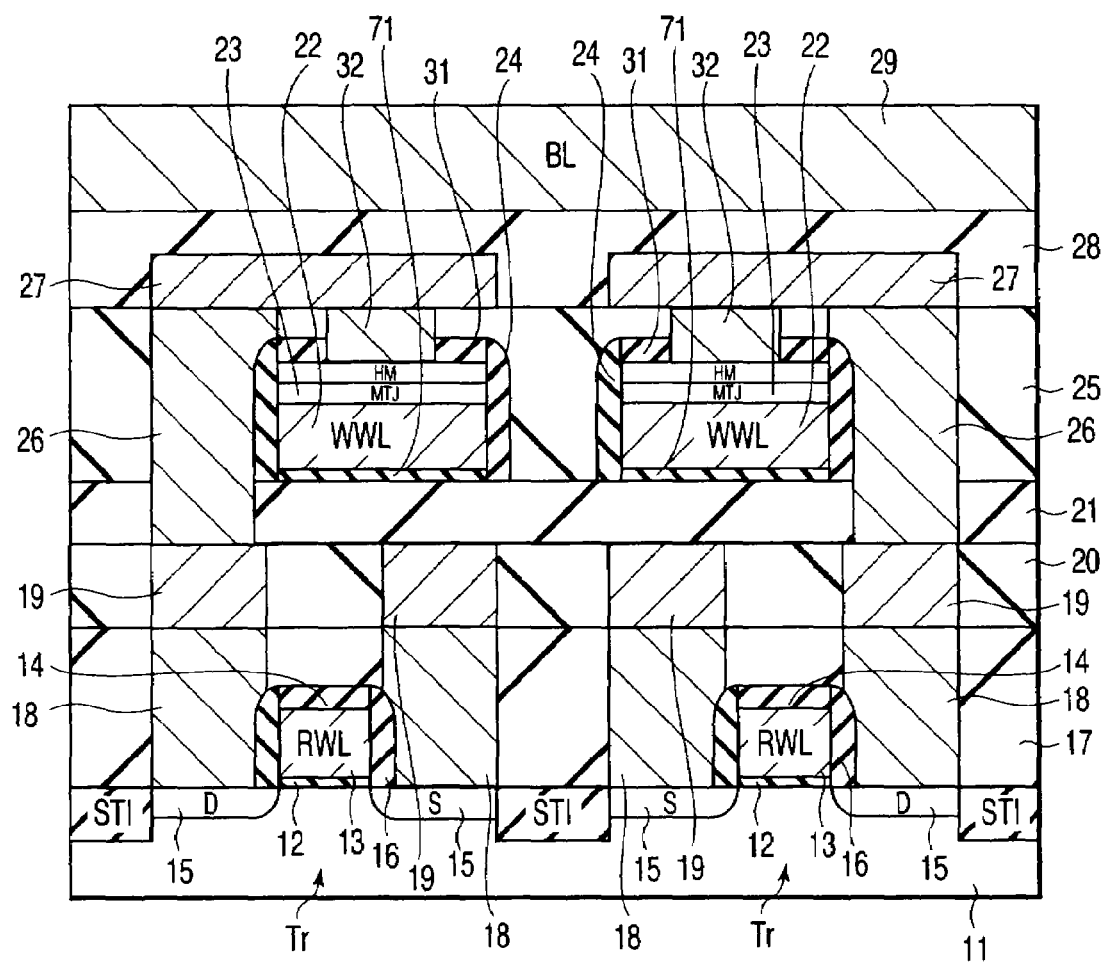

Note that it is also possible to form a magnetic insulating film 71 on the bottom surface of the write word line WWL as shown in FIGS. 30 and 31, or on the bottom surface of the bit line BL as shown in FIGS. 32 and 33. This makes it possible to more efficiently apply the write current to a selected cell, thereby increasing the write current reducing effect.

[4] Fourth Embodiment

The fourth embodiment is an example using a diode as a switching element.

Figure 35:
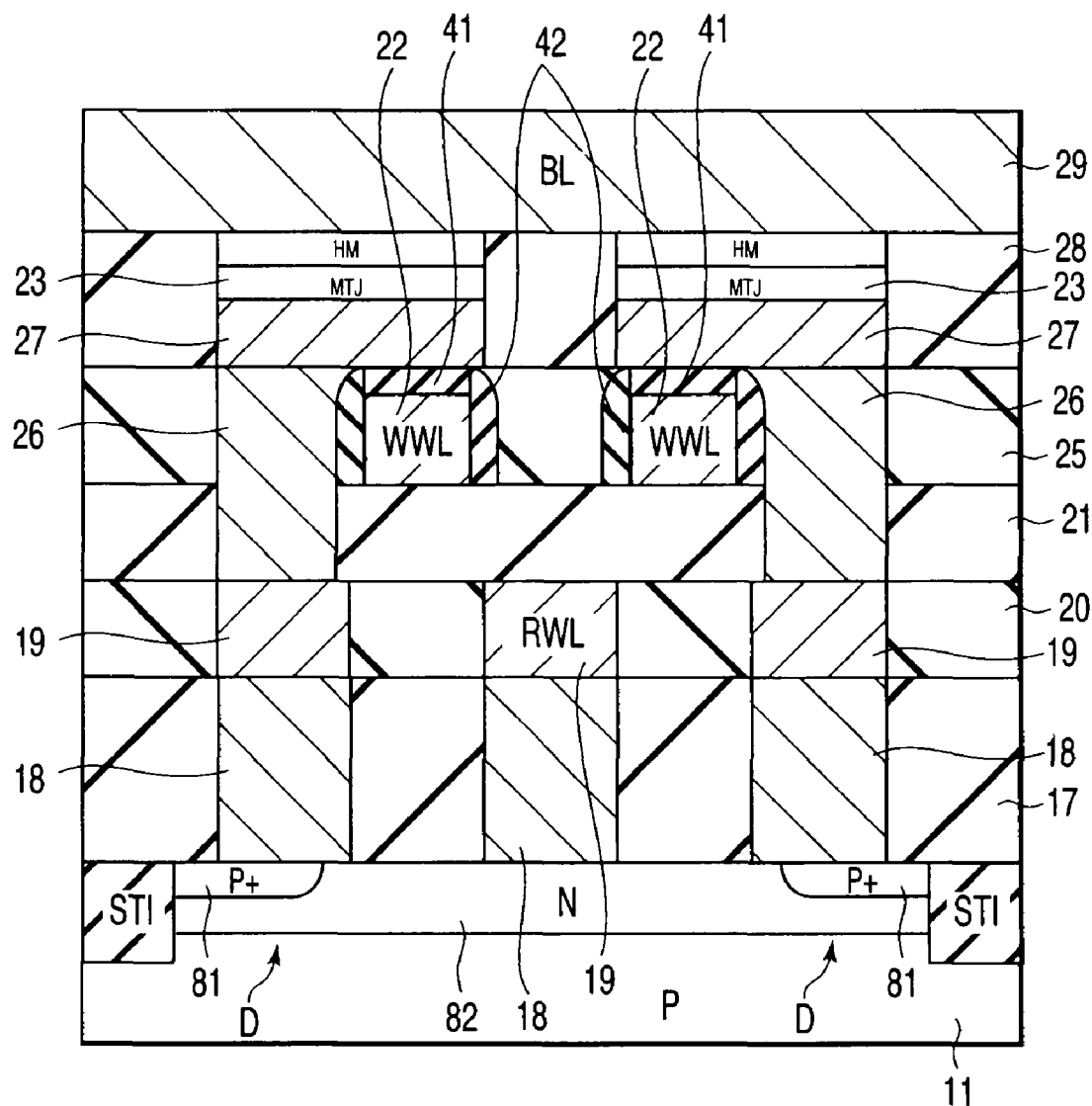

FIGS. 34 and 35 are sectional views showing a magnetic random access memory according to the fourth embodiment of the present invention. This magnetic random access memory according to the fourth embodiment will be explained below.

As shown in FIGS. 34 and 35, the difference from each embodiment described above is that a diode D is used as a switching element instead of a MOS transistor. The diode D is, for example, a p-n junction diode and has a p-type diffusion layer 81 and n-type diffusion layer 82.

The above fourth embodiment can achieve the same effects as the individual embodiments described above. In addition, the use of the diode D as a switching element eliminates the influence of the size of a MOSFET, so the cell density can further increase.

[5] Fifth Embodiment

The fifth embodiment is an example using a so-called "via hole process" or "dual damascene process" as the method of forming the contacts 26 and wirings 27 in each embodiment described above.

Figure 36:
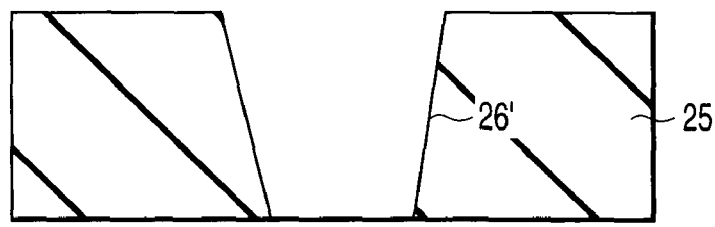
FIGS. 36A to 36C are schematic sectional views showing magnetic random access memory manufacturing steps using a via hole process according to the fifth embodiment of the present invention.
Figure 36:
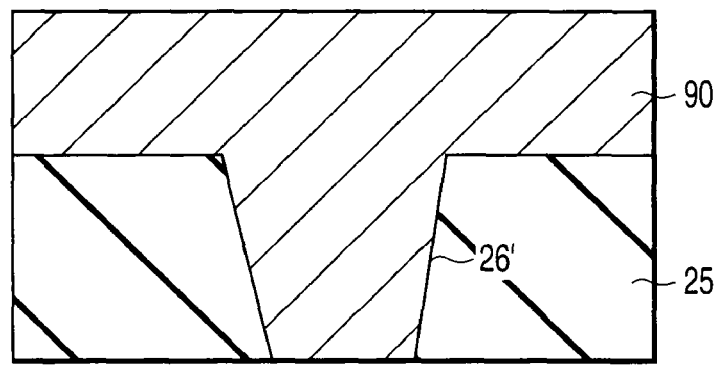
Figure 36:
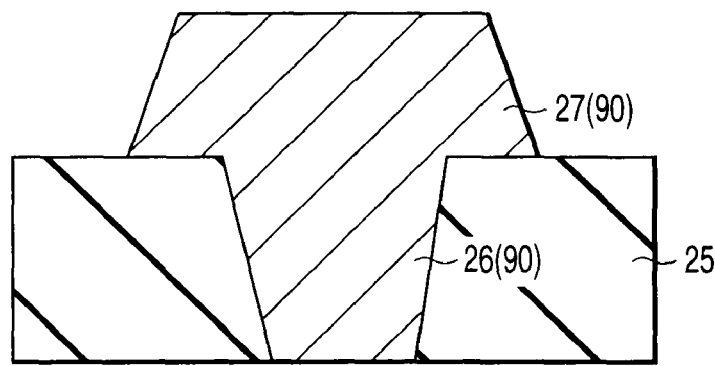

FIGS. 36A to 36C are schematic sectional views showing magnetic random access memory manufacturing steps using the via hole process according to the fifth embodiment of the present invention. The via hole process according to the fifth embodiment will be briefly explained below.

As shown in FIG. 36A, a hole 26' is formed in an interlayer insulating film 25. Then, as shown in FIG. 36B, a metal material 90 consisting of AlCu or the like is formed by sputtering to fill the hole 26'. As shown in FIG. 36C, the metal material 90 on the interlayer insulating film 25 is processed by RIE. Consequently, a contact 26 and wiring 27 are formed.

FIGS. 37A to 37D are schematic sectional views showing magnetic random access memory manufacturing steps using the dual damascene process according to the fifth embodiment of the present invention. The dual damascene process according to the fifth embodiment will be briefly explained below.

Figure 37A:
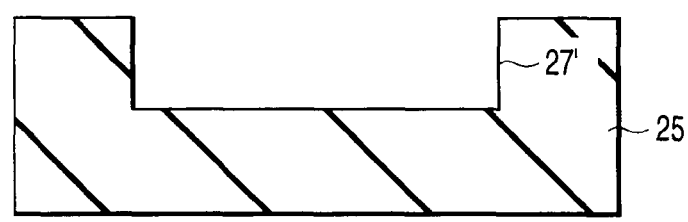
FIGS. 37A to 37D are schematic sectional views showing magnetic random access memory manufacturing steps using a dual damascene process according to the fifth embodiment of the present invention.
Figure 37B:
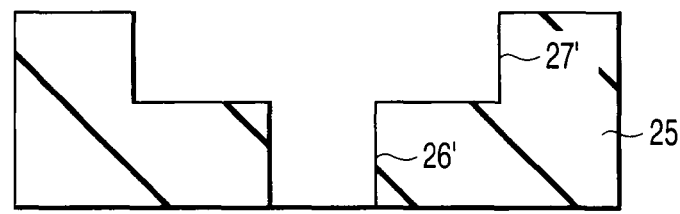
Figure 37C:
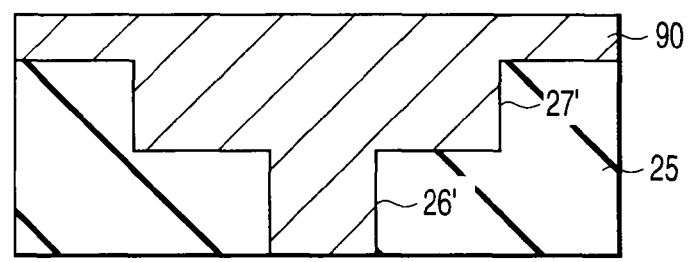
Figure 37D:
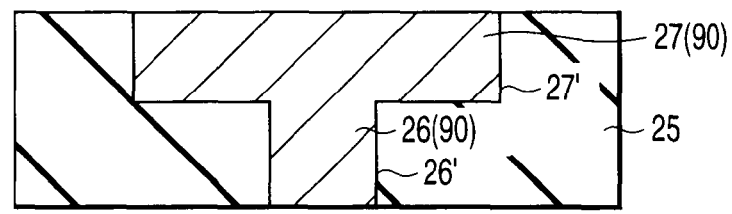

As shown in FIG. 37A, a wiring trench 27' is formed in an interlayer insulating film 25. Then, as shown in FIG. 37B, a hole is formed in the interlayer insulating film 25 from the bottom surface of the wiring trench 27', thereby forming a hole 26'. As shown in FIG. 37C, a metal material 90 consisting of Cu or the like is formed by sputtering to fill the wiring trench 27' and hole 26'. As shown in FIG. 37D, the metal material 90 is planarized by CMP until the interlayer insulating film 25 is exposed. As a result, a contact 26 and wiring 27 are formed.

Note that FIGS. 36A to 36C and 37A to 37D are schematic views, so the shapes of the contact 26 and wiring 27 can be variously changed to be applicable to each embodiment. It is of course also possible to add, around the contact 26 and wiring 27, an element (for example, the bit line BL shown in FIG. 1) existing in each embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory manufacturing method comprising:
    forming a switching element on a semiconductor substrate;
    forming a first wiring above the switching element;
    forming, on the first wiring, a magnetoresistive effect element having a fixed layer, a recording layer, and a nonmagnetic layer formed between the fixed layer and the recording layer;
    forming a first side insulating film on side surfaces of the first wiring, and the magnetoresistive effect element;
    forming a first interlayer insulating film covering the magnetoresistive effect element;
    forming a first contact hole which exposes a portion of the first side insulating film;
    forming, in the first contact hole, a first contact connecting to the switching element;
    forming a second wiring above the first contact and the magnetoresistive effect element to electrically connect the magnetoresistive effect element and the switching element by the second wiring; and
    forming a second interlayer insulating film on the second wiring.

2. The method according to claim 1, wherein a side surface of the magnetoresistive effect element and the side surface of the first wiring are simultaneously processed.

3. The method according to claim 1, further comprising forming a second contact hole in the first interlayer insulating film above the magnetoresistive effect element to connect the magnetoresistive effect element with the second wiring.

4. A magnetic random access memory manufacturing method comprising:
- forming a switching element on a semiconductor substrate;
- forming a first wiring above the switching element;
- forming a top insulating film on the first wiring;
- forming a first side insulating film on side surfaces of the first wiring and the top insulating film;
- forming a first interlayer insulating film covering the first side insulating film and the top insulating film;
- exposing the top insulating film by planarizing the first interlayer insulating film;
- forming a contact hole which exposes a portion of the first side insulating film;
- forming, in the contact hole, a first contact connecting to the switching element;
- forming a second wiring on the first contact and the top insulating film to electrically connect the second wiring and the switching element;
- forming, on the second wiring, a magnetoresistive effect element having a fixed layer, a recording layer, and a nonmagnetic layer formed between the fixed layer and the recording layer; and
- forming a third wiring above the magnetoresistive effect element.

5. A magnetic random access memory manufacturing method comprising:
- forming a switching element on a semiconductor substrate;
- forming a first wiring above the switching element by a damascene process to form a first insulating film on side and bottom surfaces of the first wiring;
- forming a top insulating film on the first wiring and the first insulating film;
- forming a first interlayer insulating film covering the top insulating film;
- exposing the top insulating film by planarizing the first interlayer insulating film;
- forming a contact hole which exposes a portion of the first insulating film;
- forming, in the contact hole, a first contact connecting to the switching element;
- forming a second wiring on the first contact and the top insulating film to electrically connect the second wiring and the switching element;
- forming, on the second wiring, a magnetoresistive effect element having a fixed layer, a recording layer, and a nonmagnetic layer formed between the fixed layer and the recording layer; and
- forming a third wiring above the magnetoresistive effect element.

* * * * *